United States Patent
Kawashima et al.

(10) Patent No.: US 7,126,667 B2
(45) Date of Patent: Oct. 24, 2006

(54) EXPOSURE APPARATUS AND METHOD

(76) Inventors: Miyoko Kawashima, Canon Kabushiki Kaisha 3-30-2, Shimomaruko, Ohta-ku, Tokyo (JP); Akiyoshi Suzuki, Canon Kabushiki Kaisha 3-30-2, Shimomaruko, Ohta-ku, Tokyo (JP)

( * ) Notice: Subject to any disclaimer, the term of this patent is extended or adjusted under 35 U.S.C. 154(b) by 0 days.

(21) Appl. No.: 11/377,184

(22) Filed: Mar. 17, 2006

(65) Prior Publication Data

US 2006/0158629 A1    Jul. 20, 2006

Related U.S. Application Data

(62) Division of application No. 11/229,541, filed on Sep. 20, 2005, now Pat. No. 7,046,337, which is a division of application No. 10/732,768, filed on Dec. 9, 2003, now Pat. No. 6,992,750.

(30) Foreign Application Priority Data

Dec. 10, 2002    (JP) .............................. 2002-358764

(51) Int. Cl.
  *G03B 27/42* (2006.01)
  *G03B 27/52* (2006.01)
  *G03B 27/72* (2006.01)
(52) U.S. Cl. ........................................... 355/53; 30/71
(58) Field of Classification Search .................. 355/52, 355/53, 55, 67–71; 356/399–401; 250/548; 359/485
See application file for complete search history.

(56) References Cited

U.S. PATENT DOCUMENTS 3,648,587 A * 3/1972 Stevens ........................ 355/44
4,346,164 A     8/1982 Tabarelli et al.
4,480,910 A * 11/1984 Takanashi et al. ............ 355/30
4,509,852 A     4/1985 Tabarelli et al.
5,610,683 A * 3/1997 Takahashi ..................... 355/53
5,673,103 A     9/1997 Inoue et al.
5,715,039 A     2/1998 Fukuda et al.
6,404,482 B1    6/2002 Shiraishi
6,788,477 B1 * 9/2004 Lin ............................ 359/820
2004/0057036 A1  3/2004 Kawashima et al.

FOREIGN PATENT DOCUMENTS

EP     0 887 708 A2    12/1998
JP     62-065326        3/1987

(Continued)

OTHER PUBLICATIONS

JPO Communication, dated Oct. 11, 2005, including translation (6 pgs.).

(Continued)

*Primary Examiner*—Henry Hung Nguyen

(57) ABSTRACT

An exposure method immerses, in liquid, a surface of an object to be exposed, and a surface of a projection optical system closest to the object, and projects a repetitive pattern formed on a mask via the projection optical system onto the object. The exposure method may direct exposure light having a wavelength $\lambda$ through a projection optical system that is at least partially immersed in liquid and has a numerical aperture of $n_o \cdot \sin \theta_{NA}$ greater than 0.9 in order to transfer a pattern formed on a mask onto an object to be exposed, wherein $n_o$ is a refractive index of the liquid, $\Delta n$ is the fluctuation of the refractive index of the liquid, $\theta_{NA}$ is the largest angle common to the liquid and a resist material applied to the object to be exposed, and d is a thickness of the liquid in an optical-axis direction of the projection optical system which satisfies $d \leq (0.03\lambda) \cos \theta_{NA}/\Delta n$.

1 Claim, 17 Drawing Sheets

FOREIGN PATENT DOCUMENTS

| | | |
|---|---|---|
| JP | 06-053120 | 2/1994 |
| JP | 06-140306 | 5/1994 |
| JP | 06140304 A * | 5/1994 |
| JP | 08-316125 | 11/1996 |
| JP | 10-303114 | 11/1998 |
| JP | 10303114 * | 11/1998 |
| JP | 10-340846 | 12/1998 |
| KR | 10-245414 | 11/1999 |

OTHER PUBLICATIONS

KPO Communication, dated Nov. 21, 2005, including translation (4 pgs).

* cited by examiner

EXPOSURE APPARATUS AND METHOD

This application is a divisional of application Ser. No. 11/229,541, filed Sep. 20, 2005, now U.S. Pat. No. 7,046,337 incorporated by reference, which is a divisional of application Ser. No. 10/732,768, filed Dec. 9, 2003, now U.S. Pat. No. 6,992,750 B2, issued Jan. 31, 2006.

This application claims the benefit of priority based on Japanese Patent Application No. 2002-358764, filed on Dec. 10, 2002, which is hereby incorporated by reference herein in its entirety as if fully set forth herein.

BACKGROUND OF THE INVENTION

The present invention relates generally to an exposure method and apparatus used to fabricate various devices including semiconductor chips such as ICs and LSIs, display devices such as liquid crystal panels, sensing devices such as magnetic heads, and image pick-up devices such as CCDs, as well as fine contact hole patterns used for micromechanics, and more particularly to a so-called immersion type exposure method and apparatus that immerse, in liquid, a surface of an object to be exposed, and a bottom surface of a projection optical system closest to the object, and expose an object via the liquid.

Reduction projection exposure apparatus has been conventionally employed which use a projection optical system for projecting a circuit pattern formed on a mask (reticle) onto a wafer, etc. and for transferring the circuit pattern, in manufacturing such fine semiconductor devices as semiconductor memories and logic circuits in the photolithography technology.

The critical dimension transferable by the projection exposure apparatus is proportionate to a wavelength of light used for exposure, and inversely proportionate to the numerical aperture ("NA") of the projection optical system. The shorter the wavelength is, the better the resolution is. Smaller resolution has been demanded with a demand for finer semiconductor devices. The exposure light is requested to move to small wavelength, and the projection optical system is expected to improve resolution using higher NA. Because of the difficulty of changing the exposure wavelength, a projection optical system has accelerated an improvement of its NA; for example, a projection optical system having NA=0.9 has been developed.

On the other hand, light sources for the exposure apparatus have changed from a KrF laser (with a wavelength of 248 nm) to an ArF laser (with a wavelength of 193 nm). At present, an $F_2$ laser (with a wavelength of 157 nm) and EUV (with a wavelength of 13.5 nm) have been developed as next generation light sources.

In such a situation, immersion exposure has called attentions, as disclosed in Japanese Patent Publication No. 10-303114, as a method that uses ArF laser (with a wavelength of 193 nm) and $F_2$ laser (with a wavelength of 157 nm) for improved resolution. The immersion exposure uses a liquid as a medium at a wafer side. It fills the space between the projection optical system and a wafer, to promote a higher NA. Specifically, the projection optical system has a numerical aperture ("NA") of n·sin θ, where "n" is a refractive index of the liquid, and NA can increase up to "n".

Influence of polarized light on imaging performance becomes non-negligible as NA becomes higher and higher, because the imaging performance becomes different according to polarization directions as the light has a larger incident angle upon a wafer.

The performance for two-beam imaging is much more affected by polarization than that for three-beam imaging. In the three-beam imaging that forms an image through interference among three beams, i.e., the 0th order beam and the ±1st order diffracted beams, an angle does not reach 90° between the 0th order beam and the 1st order diffracted beam and between the 0th order beam and the −1st order diffracted beam, which form a basic frequency for imaging, and the influence of polarization does not appear significantly. On the other hand, two-beam imaging includes the interference between two 1st diffracted beams and that between the 0th order light and one of the ±1st order diffracted beams. The influence of polarization on the imaging performance is serious because two beams that form the basic frequency have large angles.

Moreover, in the immersion case, two-beam imaging can problematically meet a condition in that no image is formed at all in a certain polarized light direction. This phenomenon has not occurred in a conventional non-immersion optical system. When two interfering beams are supposed to form an image as shown in FIG. 16A, p-polarized beams with a polarization direction on the paper surface do not interfere with each other or do not contribute to imaging because they form an angle of 90°. When two beams are in symmetry and form an angle of 90°, an incident angle is 45° and sin 45°≃0.7.

On the other hand, s-polarized beams shown in FIG. 16B have a polarization direction orthogonal to the paper surface and form an image with good contrast. This fact now defines a polarization direction that forms an image with good contrast as an s-polarized component or s-polarized light. As discussed, the s-polarized light has a polarization direction orthogonal to the paper surface when two beams interfere with each other on the paper surface. The polarization direction has implications with a direction in which a pattern is formed. When an interference fringe is formed by two beams, a direction of s-polarized light accords with each longitudinal direction of an interference fringe formed by two beams: An X direction is a direction of the s-polarized light in forming an interference pattern whose fine structure extends in the X direction. A Y direction is a direction of the s-polarized light in forming an interference pattern whose fine structure extends in the Y direction.

When two-beam interference is considered which forms an image through interference between two beams having angles of $\pm\theta_r$ in resist, where $n_o$ is a refractive index of a medium between a projection optical system and the wafer, $\theta_o$ is an angle in the medium, and $n_r$ is a refractive index of the resist, Equation (1) below is established from the Snell's law:

$$n_r \cdot \sin \theta_r = n_o \cdot \sin \theta_o \quad (1)$$

When the medium is the air, Equation (2) below is established since $n_o=1$ and $\sin \theta_o < 1$:

$$n_r \cdot \sin \theta_r = n_o \cdot \sin \theta_o < 1 \quad (2)$$

In the case of ArF excimer laser, the resist typically has a refractive index $n_r=1.7$, and Equation (2) leads to sin $\theta_r<0.59$. Thus, when the medium is the air, the angle $\theta_r$ in the resist never shows sin $\theta_r=0.7$. The cross angle of 90° condition in resist, consequently, never occurs.

On the other hand, in the case of immersion where the medium is liquid, Equation (3) below is established. When the medium has a refractive index $n_o=1.47$:

$$n_r \cdot \sin \theta_r = n_o \cdot \sin \theta_o < 1.47 \quad (3)$$

Since the resist usually has the refractive index $n_r=1.7$, $\sin\theta_r<0.86$. Thus, when the medium is liquid, $\theta_r$ can attain the condition $\sin\theta_r<0.7$.

Again, a condition never meets $\sin\theta_r<0.7$ when the medium is the air, whereas a condition can meet $\sin\theta_r<0.7$ when the medium is liquid, whereby the p-polarized light does not interfere and the contrast from the p-polarized light becomes zero. When the illumination light is non-polarized, only the s-polarized light, which is the half of the incident light, contributes to imaging. The p-polized light does not contribute to the imaging, thus halving the contrast, and creating a reduced contrast problem.

For example, in the case of ArF excimer laser, Equation (4) below is established when the medium is water and $n_o=1.47$:

$$\sin\theta_o = \frac{n_r}{n_o}\sin\theta_r = \frac{1.7}{1.47}\sin 45° = 0.81 \quad (4)$$

As a consequence, water as the medium causes a condition that provides no interference of p-polarized light when $\sin\theta_o=0.81$. Thus, the p-polarized light does not form an image when an incident angle in the medium approximately meets $\sin\theta_o=0.8$. This problem is inevitable since an optical system for immersion is required to have super-high NA, which means much larger than 1.0. In this case, the angle in the medium meets $\sin\theta_o=0.8$. Even in case of $F_2$ excimer laser, the similar relationship is established when $\sin\theta_o$ is approximately 0.8 since the medium has a refractive index of around 1.36 and the resist has a refractive index of 1.5 or higher.

It is known that increased refractive indices of the resist and liquid are effective to increase NA. The resist and liquid have different refractive indices according to their materials. As disclosed in U.S. Pat. No. 4,346,164, a small difference of refractive index between the resist and liquid is preferable, but, in the usual case, sinOr in the resist is slightly smaller than $\sin\theta_o$ in the medium. The inventors have discovered that since it is anticipated that the resist for exclusive use with the immersion will be developed, it is preferable to set $\sin\theta_o$ in the medium in the exposure apparatus side to be approximately equivalent with $\sin\theta_r$ in the resist. Thus, the condition that provides no interference of p-polarized light may be regarded as $\sin\theta_o \approx \sin\theta_r=0.7$.

As discussed, the high NA projection optical system is necessary for finer patterns, while the imaging performance deteriorates due to the p-polarization features of the high NA imaging beam. In some cases, the desired pattern cannot be formed as is predicted by the simple scalar theory, which does not count the polarization effect.

BRIEF SUMMARY OF THE INVENTION

Accordingly, it is an exemplified object of the present invention to provide an immersion type exposure method and apparatus which prevent deteriorated imaging performance due to influence of polarization, maintain desired contrast, and form desired patterns.

An exposure method of one aspect according to the present invention that immerses, in liquid, a surface of an object to be exposed, and a surface of a projection optical system closest to the object, and projects a pattern formed on a mask via the projection optical system onto the object, forms on a pupil of the projection optical system an effective light source that emits, from an axis orthogonal to an optical axis of the projection optical system, light that is parallel to the extending direction of the pattern and has an incident angle $\theta$ in the liquid, wherein the light includes only s-polarized light in an area of an incident angle $\theta$ that satisfies $90°-\theta_{NA} \leq \theta \leq \theta_{NA}$, where $\theta_{NA}$ is the largest value of the incident angle $\theta$.

An exposure method of another aspect according to the present invention that transfers a pattern formed on a mask onto an object to be exposed via a projection optical system that is at least partially immersed in liquid and has a numerical aperture of $n_o \cdot \sin\theta_{NA}$, where $n_o$ is a refractive index of the liquid, illuminates the resist so that, where an X-axis is one of the extending direction of the pattern formed on the mask and a direction orthogonal to X-direction, a Y-axis, and $\theta$ is an incident angle to the resist from the liquid, an area of an effective light source formed on a pupil of the projection optical system corresponds to the incident angle $\theta$ that satisfies $90°-\theta_{NA} \leq \theta \leq \theta_{NA}$, has a linearly polarized component in a orthogonal direction both on the X-axis and Y-axis.

An exposure method of still another aspect according to the present invention that transfers a pattern formed on a mask onto an object to be exposed via a projection optical system that is at least partially immersed in liquid irradiates only s-polarized light onto an area on an effective light source formed on a pupil of the projection optical system, on which area two imaging exposure beams generate an orthogonal state.

The area may have a canoe shape formed by intersecting two circles, a shape by linearly cutting down part of a circle, a shape by linearly cutting down part of an annular shape, or a circular shape.

An exposure method of still another aspect according to the present invention transfers a pattern formed on a mask onto an object to be exposed via exposure light having a wavelength $\lambda$ and a projection optical system that is at least partially immersed in liquid and has a numerical aperture of $n_o \cdot \sin\theta_{NA}$, where $n_o$ is a refractive index of the liquid, wherein the liquid has a thickness d in an optical-axis direction of the projection optical system which satisfies $d \leq 3000 \cdot \lambda \cdot \cos\theta_{NA}$.

An exposure method of another aspect according to the present invention transfers a pattern formed on a mask onto an object to be exposed via a projection optical system that is at least partially immersed in liquid, wherein a surface of the projection optical system closest to the object contacts the liquid and is protected from the liquid.

An exposure apparatus of another aspect according to the present invention for transferring a pattern formed on a mask onto an object to be exposed includes a projection optical system that is at least partially immersed in liquid and has a numerical aperture of $n_o \cdot \sin\theta_{NA}$, where $n_o$ is a refractive index of the liquid; and a polarization control part for controlling polarization on an area on a pupil of said projection optical system which corresponds to a range of an angle $\theta$ at which exposure light exits from the projection optical system, the range satisfying $90°-\theta_{NA} \leq \theta \leq \theta_{NA}$, where $\theta_{NA}$ is the largest value of the incident angle $\theta$.

An exposure apparatus for transferring a pattern formed on a mask onto an object to be exposed includes a projection optical system that is at least partially immersed in liquid, and a polarization control part for controlling a polarization on an area on a pupil of said projection optical system, on which area two imaging exposure beams generate an orthogonal state.

The polarization control part may set the polarization to only s-polarized light. The polarization control part may include a polarization element arranged approximately conjugate to a pupil surface of the projection optical system. The polarization control part may include an aperture stop arranged on a pupil surface of the projection optical system, wherein the aperture stop has an aperture shape that is a canoe shape formed by intersecting two circles. The polarization control part may include an aperture stop arranged on a pupil surface of the projection optical system, wherein the aperture stop has an aperture shape by linearly cutting down part of a circle. The polarization control part may include an aperture stop arranged on a pupil surface of the projection optical system, wherein the aperture stop has an aperture shape by linearly cutting down part of an annulus.

The polarization control part may include an aperture stop arranged on a pupil surface of the projection optical system, wherein the aperture stop has a circular aperture shape. The polarization control part may maintain contrast of about 0.7 through control.

An exposure apparatus of another aspect according to the present invention includes a projection optical system that transfers a pattern formed on a mask onto an object to be exposed, said exposure apparatus immersing, in liquid, a surface of the object, and a surface of the projection optical system closest to the object, and satisfying $d \leq 3000 \cdot \lambda \cdot \cos \theta_o$ where $n_o \cdot \sin \theta_o$ is a numerical aperture of the projection optical system, $n_o$ is a refractive index of the liquid, $\lambda$ (nm) is a wavelength of light used for exposure, and d is a thickness of the liquid in an optical-axis direction of the projection optical system. The exposure apparatus may further include a sputtered film, wherein the surface of the projection optical system closest to the object contacts the liquid, and is located on a calcium fluoride substrate and covered with the sputtered film.

A device manufacture method includes the steps of exposing an object using the above exposure apparatus, and performing a predetermined process for the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin filmn magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
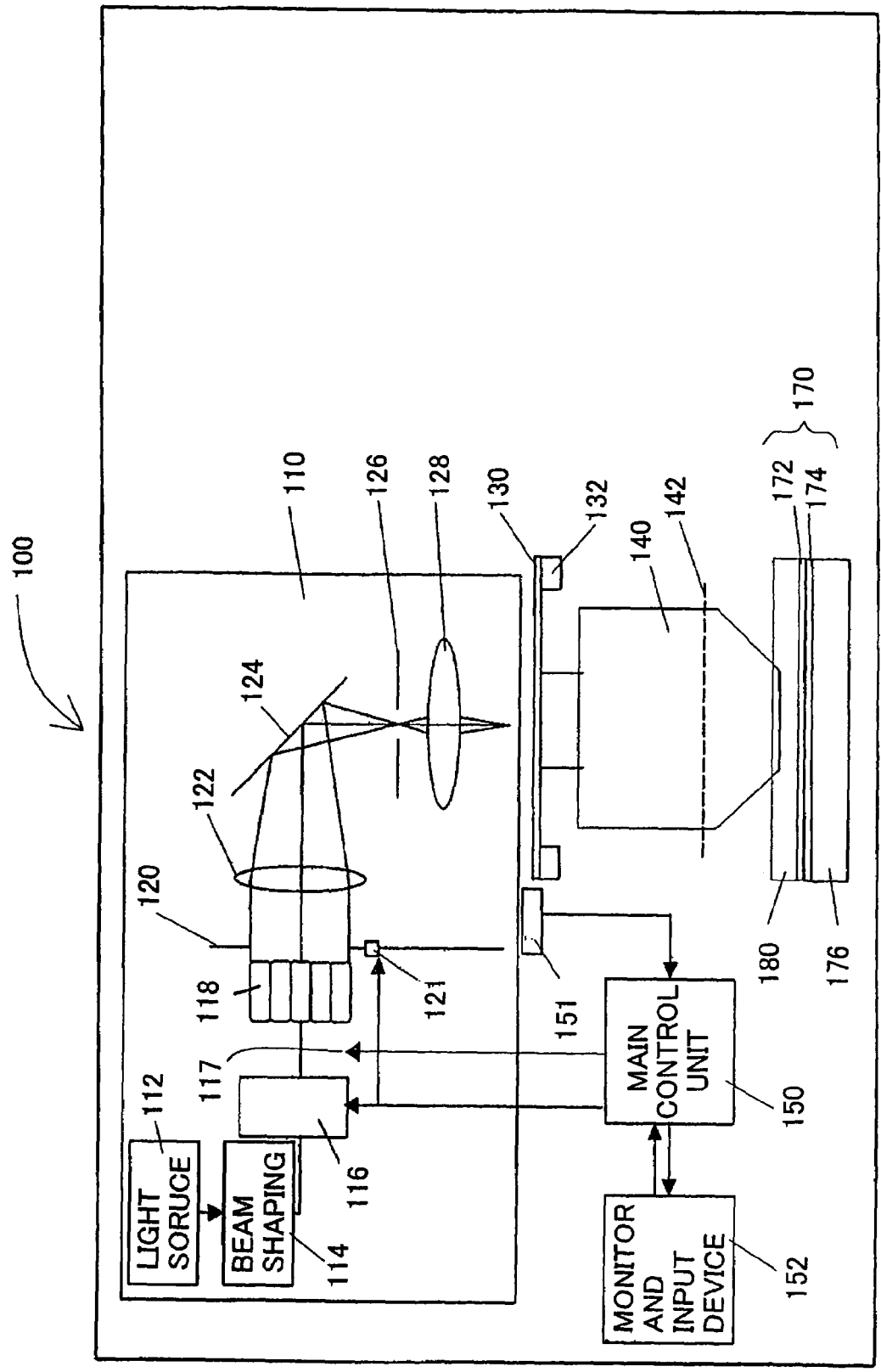
FIG. 1 is a schematic block diagram of an exposure apparatus of one embodiment, according to the present invention.

A description will now be given of an exposure apparatus 100 of one embodiment according to the present invention with reference to FIG. 1. Here, FIG. 1 is a schematic block diagram of the exposure apparatus 100. As shown in FIG. 1, the exposure apparatus includes an illumination section 110, a mask or reticle 130, a reticle stage 132, a projection optical system 140, a main control unit 150, a monitor and input device 150, a wafer 170, a wafer stage 176, and a liquid 180 as a medium. Thus, the exposure apparatus 100 is an immersion type exposure apparatus that partially or entirely immerses the space between the bottom surface of the projection optical system 140 and the wafer 170 with the liquid 180, and exposes patterns formed on the mask 130 to the wafer 170 via the liquid 180. Although the exposure apparatus 100 of the instant embodiment is a step-and-scan manner projection exposure apparatus, the present invention is applicable to a step-and-repeat manner and other exposure methods.

The illumination apparatus 100 illuminates the mask 130 on which a circuit pattern to be transferred is formed, and includes a light source section and an illumination optical system.

The light source section includes laser 112 as a light source, and a beam shaping system 114. The laser 112 may be pulsed laser such as ArF excimer laser with a wavelength of approximately 193 nm, KrF excimer laser with a wavelength of approximately 248 nm, $F_2$ laser with a wavelength of approximately 157 nm, etc. A kind of laser, the number of laser units, and a type of light source section is not limited.

The beam shaping system 114 can use, for example, a beam expander, etc., with a plurality of cylindrical lenses, and convert an aspect ratio of the size of the sectional shape of a parallel beam from the laser 112 into a desired value (for example, by changing the sectional shape from a rectangle to a square), thus reshaping the beam shape to a desired one. The beam shaping system 114 forms a beam that has a size and divergent angle necessary for illuminating an optical integrator 118 described later.

The illumination optical system is an optical system that illuminates the mask 130, and includes a condensing optical system 116, a polarization control part 117, an optical integrator 118, an aperture stop 120, a condenser lens 122, a deflecting mirror 124, a masking blade 126, and an imaging lens 128 in this embodiment. The illumination optical system 120 can cope with various illumination modes, such as conventional illumination, annular illumination, quadrupole illumination, etc.

The condensing optical system 116 includes a necessary optical elemnts, and efficiently introduces a beam with the desired shape into the optical integrator 118. In some cases, 116 involves a zoom lens system to control the shape and angular distribution of the incident beam to 118.

The condensing optical system 116 further includes an exposure dose regulator that can change an exposure dose of illumination light for the mask 130 per illumination. The exposure dose regulator is controlled by the main control unit 150. The position for monitoring the dose can be placed other place, for example, between the fly's eye lens 118 and the reticle 130.

A polarization control part 117 includes, for example, a polarization element arranged at an approximately conjugate to a pupil 142 of the projection optical system 140. The polarization control part 117 controls, as described later, a polarization in a predetermined region of an effective light source formed on the pupil 142. The polarization control part 117 can include plural types of polarization elements that are provided on a turret rotatable by an actuator (not shown), and the main control unit 150 may control driving of the actuator.

The optical integrator 118 makes uniform illumination light that illuminates the mask 130, includes as a fly-eye lens in the instant embodiment for converting an angular distribution of incident light into a positional distribution, thus exiting the light. The fly-eye lens is so maintained that its incident plane and its exit plane are in the Fourier transformation relationship, and a multiplicity of rod lenses (or fine lens elements). However, the optical integrator 118 usable for the present invention is not limited to the fly-eye lens, and can include an optical rod, a diffraction grating, a plural pairs of cylindrical lens array plates that are arranged so that these pairs are orthogonal to each other, etc.

Right after the exit plane of the optical integrator 118 is provided the aperture stop 120 that has a fixed shape and diameter. The aperture stop 120 is arranged at a position approximately conjugate to the effective light source on the pupil 142 of the projection optical system 140, as described later, and the aperture shape of the aperture stop 120 corresponds to the effective light source shape on the pupil 142 surface in the projection optical system 140. The aperture shape of the aperture stop 120 defines a shape of the effective light source, as described later. As described later, various aperture stops can be switched so that it is located on the optical path by a stop exchange mechanism (or actuator) 121 according to illumination conditions. A drive control unit 151 controlled by the main control unit 150 controls the driving of the actuator 121. The aperture stop 120 may be integrated with the polarization control part 117.

The condenser lens 122 collects all the beams that have exited from a secondary light source near the exit plane of the optical integrator 118 and passed through the aperture stop 120. The beams are reflected by the mirror 124, and uniformly illuminate or Koehler-illuminate the masking blade 126.

The masking blade 126 includes plural movable light shielding plates, and has an approximately rectangular opening corresponding to the usable area shape of the projection optical system 140. The light that has passed through the opening of the masking blade 126 is used as illumination light for the mask. The masking blade 126 is a stop having an automatically variable opening width, thus making a transfer area changeable. The exposure apparatus 100 may further include a scan blade, with a structure similar to the above masking blade 126, which makes the exposure are changeable in the scanning direction. The scan blade is also a stop having an automatically variable opening width, and is placed at an optically approximately conjugate position to the surface of the mask 130. Thus, the exposure apparatus can use these two variable blades to set the dimensions of the transfer area in accordance with the dimensions of an exposure shot.

The imaging lens 128 transfers an aperture shape of the masking blade 126 onto the reticle 130 to be illuminated, and projects a reduced image of the reticle 130 onto the wafer 170 installed on the wafer chuck.

The mask 130 has a circuit pattern or a pattern to be transferred, and is supported and driven by a mask stage 132. Diffracted light emitted from the mask 130 passes the projection optical system 140, and then is projected onto the wafer 170. The wafer 170 is an object to be exposed, and the resist is coated thereon. The mask 130 and the wafer 170 are located in an optically conjugate relationship. The exposure apparatus in this embodiment is a step-and-scan type exposure apparatus (i.e., "scanner"), and therefore, scans the mask 130 and the wafer 170 to transfer a pattern on the mask 130 onto the wafer 170. When it is a step-and-repeat type exposure apparatus (i.e., "stepper"), the mask 130 and the wafer 170 are kept stationary for exposure.

Figure 2A:
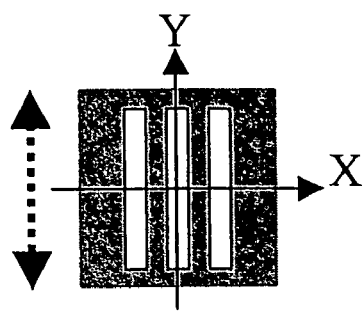
FIG. 2 is a plane view showing several exemplary patterns formed on a mask shown in FIG. 1.
Figure 2B:
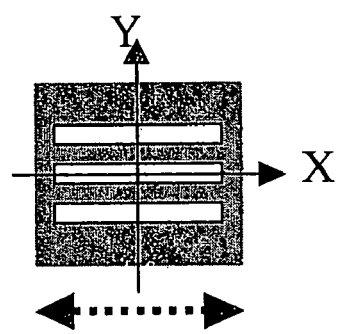
Figure 2C:
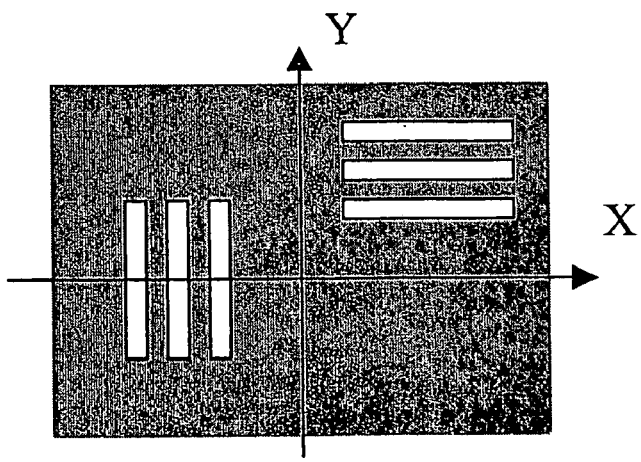

FIG. 2 shows an example of a mask pattern. FIG. 2A is a plane view of a mask pattern that has a repetitive direction in X-axis direction, and is extended in Y-axis direction. FIG. 2B is a plane view of a mask pattern that has a repetitive direction in Y-axis direction, and is extended in X-axis direction. FIG. 2C is a plane view of a mask pattern that blends these patterns.

The mask 130 is not limited to a binary mask, and may be a phase shifting mask. A pattern formed on the mask 130 may include line patterns, such as gates, contact holes or other patterns.

The mask stage 132 supports the mask 130, and is connected to a transport mechanism (not shown). The mask stage 132 and the projection optical system 140 are installed on a lens barrel stool supported via a damper, for example, to a base frame placed on the floor. The mask stage 132 can use any structure known in the art. The transport mechanism (not shown) is made up of a linear motor and the like, and drives the mask stage 132 in X-Y directions, thus moving the mask 130. The exposure apparatus 100 scans the mask 130 and the wafer 170 in a state synchronized with the main control unit 150.

The projection optical system 140 serves to image the diffracted light that has generated by the patterns formed on the mask 130 onto the wafer 170. The projection optical system 140 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration is available through a plurality of lens units made from glass materials having different dispersion values (Abbe values), or arrange a diffractive optical element such that it disperses in a direction opposite to that of the lens unit. Otherwise, the compensation of the chromatic aberration is done with the narrowing of spectral width of the laser. Nowadays, line-narrowed MOPA laser is one of the main stream.

The main control unit 150 controls the driving of each component, and particularly controls the illuminator based on the information input into the input device of the monitor and input device 152, information from the illumination apparatus 110, and a program stored in a memory (not shown). More specifically, the main control unit 150 controls, as described later, a shape of the effective light source formed on the pupil 142 of the projection optical system 140, and polarization. Control information and other information for the main control unit 150 are indicated on the display of the monitor and input device 152.

The wafer 170 is replaced with a liquid crystal plate and another object to be exposed in another embodiment. The photoresist 172 is coated on a substrate 174.

The wafer 170 is supported by a wafer stage 176. The stage 176 may use any structure known in the art, and thus a detailed description of its structure and operations is omitted. For example, the stage 176 uses a linear motor to move the wafer 170 in X-Y directions. The mask 130 and wafer 170 are, for example, scanned synchronously, and the positions of the mask stage 132 and wafer stage 176 are monitored, for example, by a laser interferometer and the like, so that both are driven at a constant speed ratio. The stage 176 is installed on a stage stool supported on the floor and the like, for example, via a dumper.

The bottom surface of the projection optical system 140 closest to the wafer 170 is immersed in the liquid 180. The liquid 180 selects its material that has good transmittance to the wavelength of the exposure light, does not contaminate the projection optical system 140, and matches the resist process. The coating of the last element of the projection optical system 140 protects the elemnt from the water.

Figure 3A:
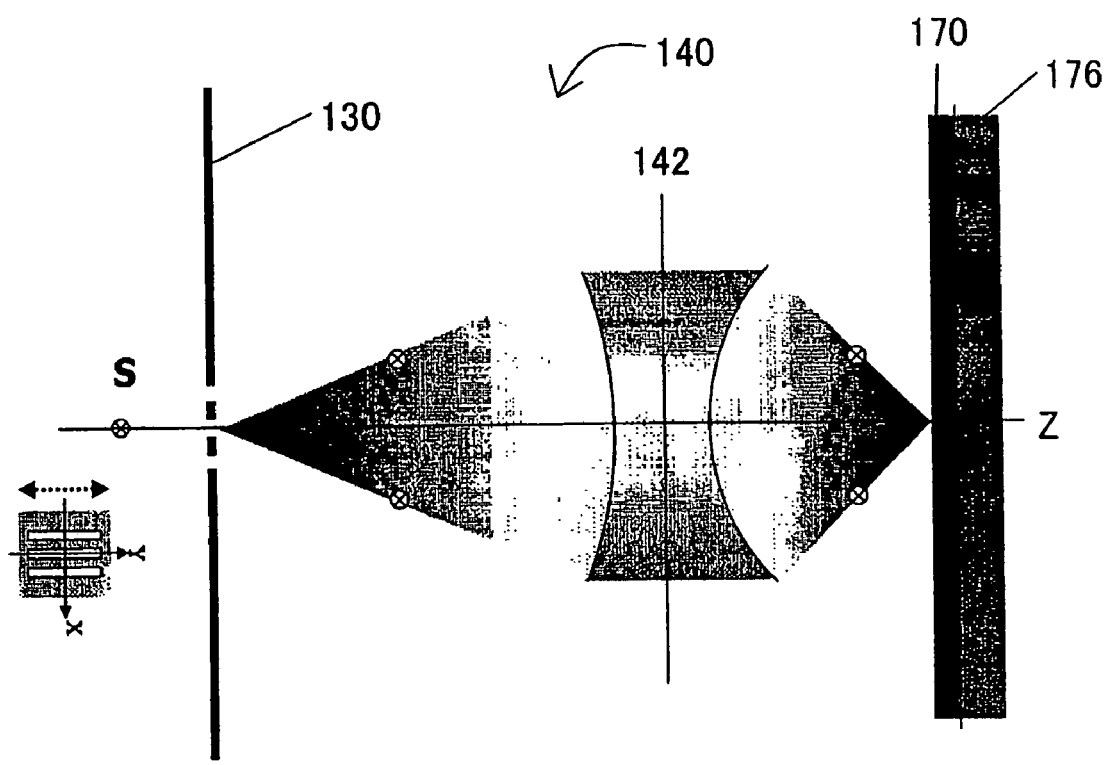
FIG. 3 is a conceptual view for explaining effects of p-polarized light and s-polarized light.
Figure 3B:
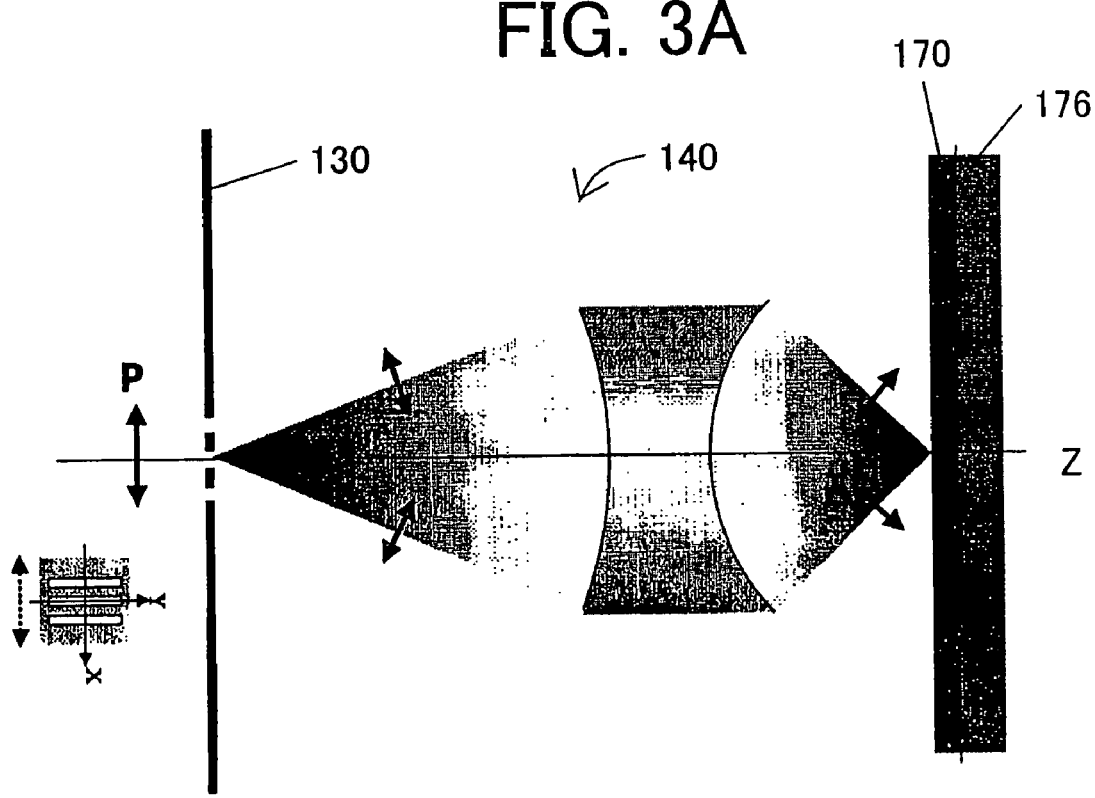
Figure 16A:
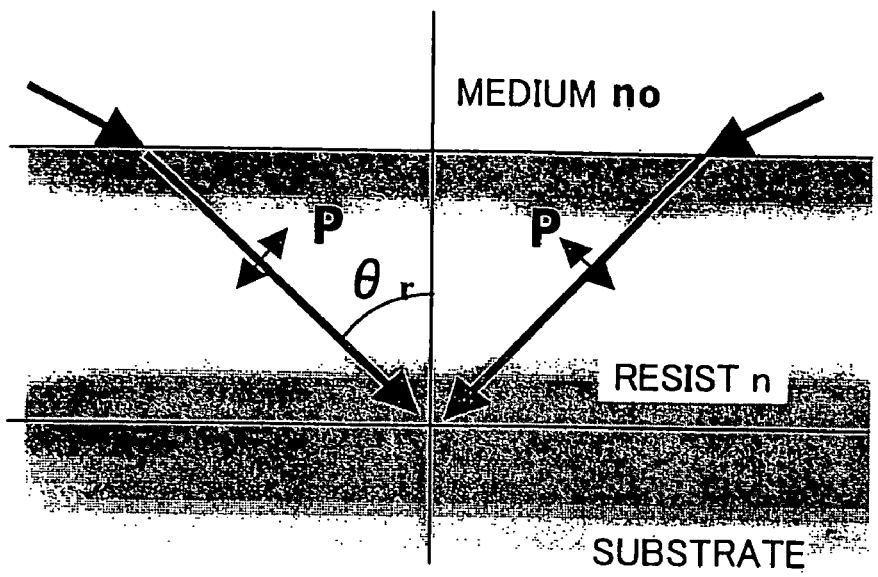
FIG. 16 is a schematic view showing a relationship between imaging and polarized light in immersion type exposure.
Figure 16B:
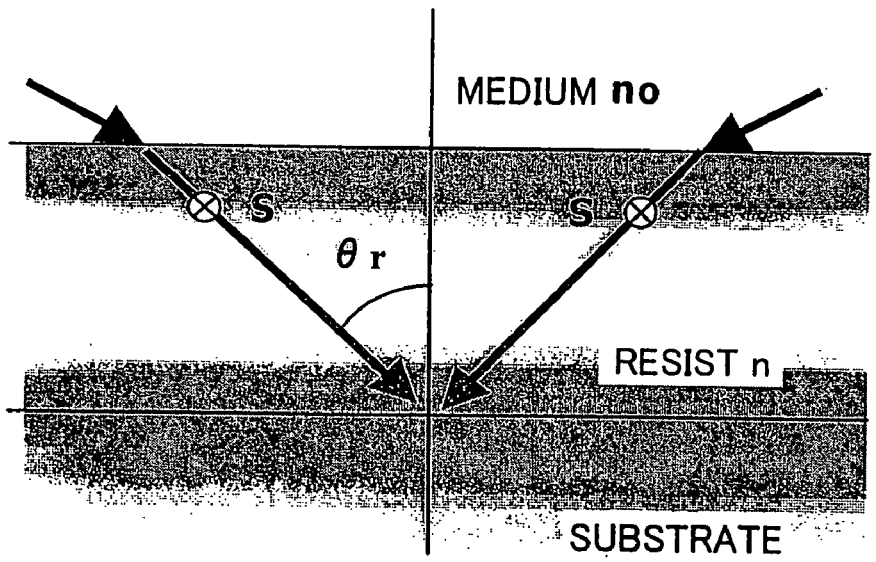

A description will now be given of polarization control by the main control unit 150. A description will now be given of an effect of polarization, with reference to FIG. 3. Here, FIGS. 3A and 3B are typical views for defining s-polarized light and p-polarized light. As shown in FIG. 3A, the s-polarized light is defined as light that polarizes in a direction perpendicular to the cross-sectional plane (paper surface) of the projection optical system 140, or the light that polarizes, as shown in FIG. 16B, perpendicular to a plane that includes two imaging beams. The p-polarized light is defined as light that polarizes in a direction parallel to the cross-sectional plane(paper surface) of the projection optical system 140, or light that polarizes, as shown in FIG. 16A, parallel to the surface that includes two imaging beams.

In other words, if we take the XYZ axis as the following definition temporarily, the s-polarized light polarizes in the Y-axis direction and the p-polarized light polarizes in the X-axis direction, where the X-axis is set in a direction parallel to the surface that includes two imaging beams or the paper surface, and the Y-axis direction is set in a direction orthogonal to the surface that includes two imaging beams or the paper surface, and a Z-axis is set in a propagation direction of the light. A fine structure in a fine pattern extends perpendicular to the paper surface and is assigned to the s-polarized light.

The imaging performance with higher resolution requires the p-polarized light that reduces the imaging contrast to be eliminated and only the s-polarized light to be used. In other words, as shown in FIG. 2A, the mask pattern that is long in the Y-axis direction should use s-polarized light for imaging, which has a polarization direction in the Y-axis direction as shown by an arrow.

Whereas, as shown in FIG. 2B, the mask pattern that is long in the X-axis direction should use s-polarized light for imaging, which has a polarization direction in the X-axis direction as shown by an arrow.

The present embodiment attempts to assign only the s-polarized light to an area on the effective light source, which allows two beams to form an angle sin $\Phi$=0.7, where $\Phi$ (deg) is half an angle between these two diffracted beams for imaging a pattern in the liquid 180.

This area corresponds an area that satisfies $90°-\theta_{NA}\leq\theta\leq\theta^{NA}$ on the effective light source formed on the pupil 142, in case of two-beam interference such as 0th order light and 1st order light or ±1st order light as in a Levenson type phase shift mask in one embodiment, where $\theta$ is an angle of light in the liquid 180 and $\theta_{NA}$ is the largest angle in the liquid. Although it is the resist that requires two beams to actually avoid forming 90°, $\theta_{NA}$ may be regarded as the largest angle common to the liquid and resist because $\theta_o$ may be considered to be almost equal to $\theta_r$ when the liquid has a refractive index close to that of the resist. In an alternative embodiment, this area is located on the effective light source formed on the pupil 142, and allows two imaging exposure beams to generate an orthogonal state.

While a description has discussed a relationship between the s-polarized light and a pattern direction, this may be converted into a pupil coordinate of the effective light source as follows: In the effective light source of illumination light on the pupil 142 of the projection optical system 140, the s-polarized light has a polarization direction along a tangential direction orthogonal to a radial line from a center of the pupil 142. Indeed, the s-polarized light is determined by a direction of a pattern to be imaged. Since actual LSI patterns often include patterns in the X and Y directions, the s-polarized light basically has a polarization direction in the X or Y direction: An effective light source area that has a polarization direction in the X direction can exist in the area having a center along the Y-axis on the pupil 142 of the projection optical system 140. An effective light source area that has a polarization direction in the Y direction can exist in the symmetrical area having a center along the X-axis on the pupil of the projection optical system. When a 45° direction is included, one example includes four directions X, Y and ±45°.

As a result of further investigations of the above conditions, this is achieved by assigning s-polarized light to a component in the illumination light emitted at an angle $\theta$ into the liquid 180 in FIG. 16C, which is expressed by the following equations in the projection optical system 140 which meets $\theta_{NA}\geq 45°$ or sin $\theta_{NA}\geq 0.7$, where $\theta_{NA}$ is the largest angle in the liquid:

$$\sin(90°-\theta_{NA})\leq\sin\theta\leq\sin\theta_{NA} \quad (5)$$

$$90°-\theta_{NA}\leq\theta\leq\theta_{NA} \quad (6)$$

Referring now to FIG. 16C, $\theta$ in Equations (5) and (6) is an incident angle to the resist. In other words, $\theta$ means the angle at which the exposure light forms relative to a perpendicular to the substrate surface. $\theta_{NA}$ is the largest incident angle of the exposure light as a maximum value of the incident angle $\theta$.

The maximum radius $\sigma_{MAX}$ of the effective light source is now considered in view of an angle without considering a refractive index, where the radius of the effective light source that is a light source distribution of the illumination optical system projected on the pupil 142. The radius of the pupil 142 is regarded 1 for nomalization. Then, Equation (6)

corresponds, when using σ, to an assignment of s-polarized light to a range expressed by Equation (7) below of the effective light source area:

$$\sigma_{IN} = \sin(90° - \theta_{NA})/\sin\theta_{NA} \leq \sigma \leq \sigma_{MAX} \quad (7)$$

where $\sigma_{MAX}$ is a parameter corresponding to the outermost part in the set effective light source distribution, and $\sigma_{MAX} \cdot \sin\theta_{NA}$ is the largest angle of the illumination light in the liquid 180.

Figure 4A:
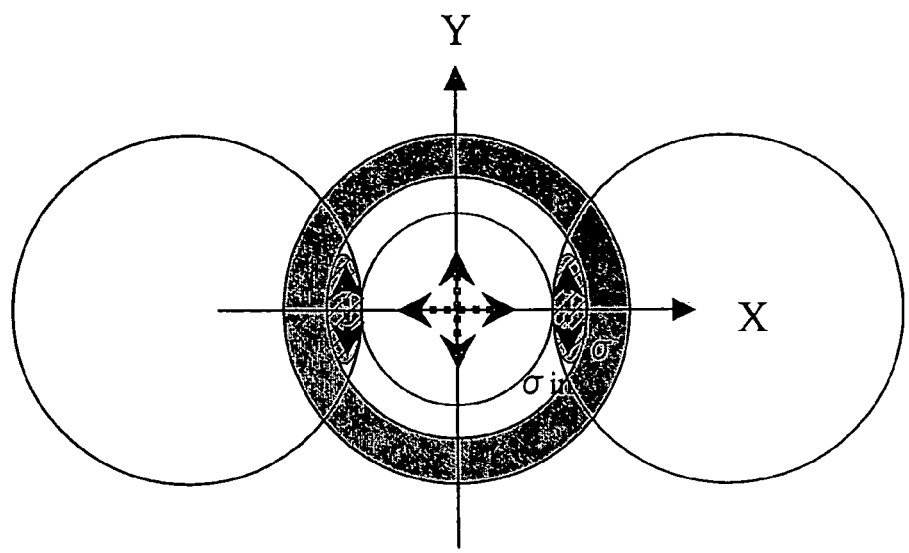
FIGS. 4A and 4B are effective light source distributions that define polarizations to expose mask patterns shown in FIGS. 2A and 2B.
Figure 4B:
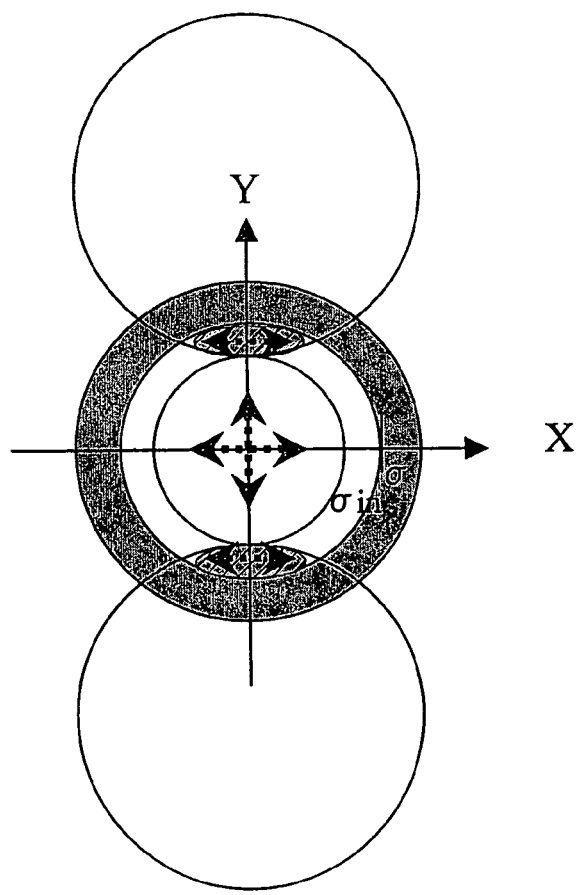

Since an actual LSI pattern often possesses specific directional property in the X and Y directions, the selection of the effective light source shape should be considered. FIGS. 4 and 5 show two-dimensional distributions of effective light sources when the directional property is considered. Here, FIG. 4A is an effective light source distribution that defines polarization to expose the mask pattern shown in FIG. 2A. FIG. 4B is an effective light source distribution that defines polarization to expose the mask pattern shown in FIG. 2B. FIG. 5 is an effective light source distribution that defines polarization to expose a mask pattern shown in FIG. 2C.

Figure 6:
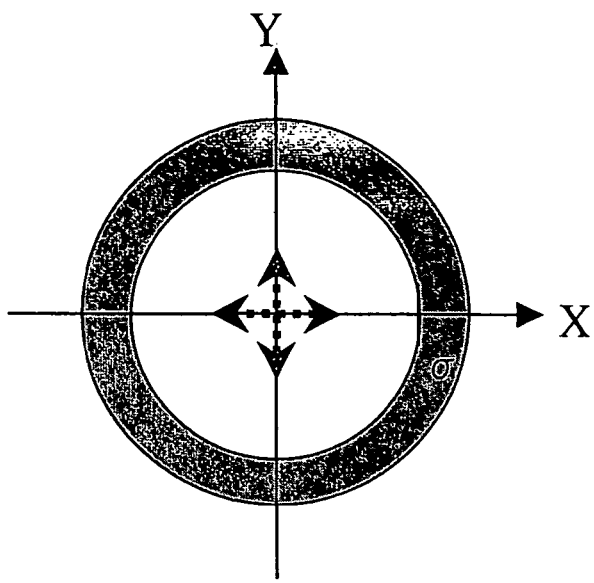
FIG. 6 is a typical view for explaining a relationship between an effective light source area and a polarization direction.

A description will now be given of a relationship between an area on the effective light source and a polarization direction, with reference to FIGS. 6 and 7. A mask pattern parallel to the Y direction is considered as shown in FIG. 2A. As shown in FIG. 6, in the conventional case, a normal effective light source has a light source within a radius σ on the effective light source in the normalized coordinates, and has the mixed polarization state in the X and Y directions, since no polarization is considered.

The s-polarized light is assigned to a polarization direction in the Y direction shown by an arrow in the imaging of the mask pattern shown in FIG. 2A. FIG. 7 shows a pupil 142 in the projection optical system 140, and whitens the effective light source area ($\leq \sigma_{MAX}$). The light that emits at an angle of $\theta_1$ from the projection optical system 140 to the liquid 180 enters a position at $\sin\theta_1/\sin\theta_{NA}$ on a normalized coordinate of the effective light source. The mask pattern shown in FIG. 2A is a sufficiently fine pattern below 0.5 in terms of a $k_1$ factor (=R/(λ/NA)). Two black dots connected by a broken line in FIG. 7 indicate a two-beam interference pair of 0th and −1st order lights or 0th and +1st order lights. A distance between two black dots is expressed as $1/(2k_1)$ in the normalized coordinate. The diffracted beam travels in a direction orthogonal to a direction in which each fine pattern extends.

The immersion allows, as discussed above, a pair of beams to form an angle that approximately meets sin Φ=0.7, whereby the p-polarized light does not provide the contrast at all. Therefore, the image contrast can be improved through the assignment of the polarization direction to the Y direction as the s-polarized light in the area that generates such a pair. A hatching region indicates the area that has a polarization direction to be controlled according to the pattern. The hatching region requires conditions that one of the two black dots which indicate the 0th order light is included in a white part indicative of the effective light source, and the other one indicative of the ±1st light is included in the pupil. The hatching region is found using the condition that the both ends of the segment, having the distance of $1/(2k_1)$ between a pair of black dots, exist in the pupil 142. In this case, two hatching regions (FIG. 8A) have a canoe shape as a result of an intersection of two circles. The present embodiment is characterized in that the angle θ in the liquid 180 meets the following condition with respect to a boundary along the X-axis:

$$\sin(90° - \theta_{NA}) \leq \sin\theta \leq \sigma_{MAX} \cdot \sin\theta_{NA} \quad (8)$$

where $\sigma_{MAX}$ is a parameter corresponding to the outermost part in the effective light source, and $\sigma_{MAX} \cdot \sin\theta_{NA}$ is the largest angle of the illumination light in the liquid.

Figure 7:
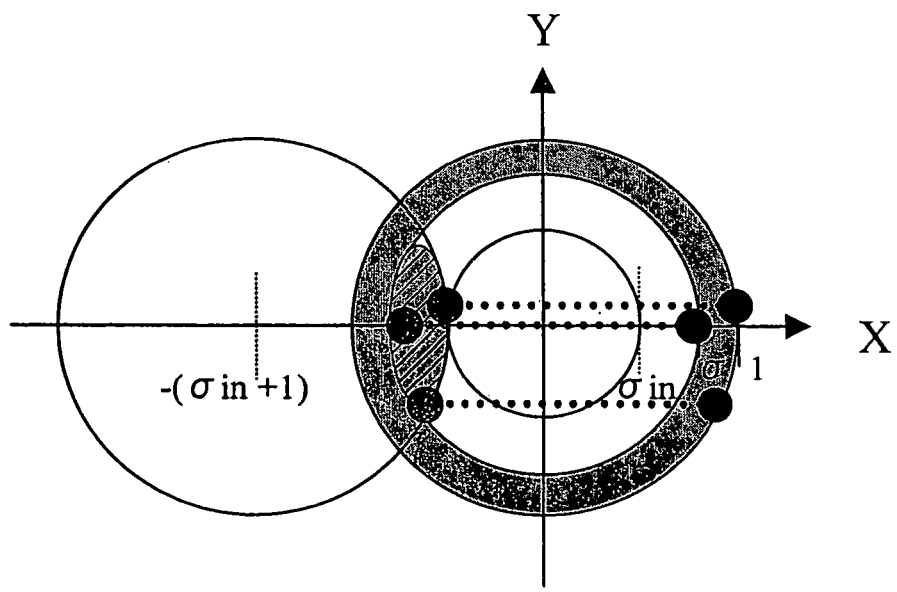
FIG. 7 is a typical view for explaining a relationship between an effective light source area and a polarization direction.

In FIG. 7, a line outside the region is a circle with a radius of the maximum effective light source $\sigma_{MAX}$ and a center at X=0. On the other hand, the inside forms a circle with a radius of 1 and a center at X=−($\sigma_{IN}$+1) where $\sigma_{IN}$ is expressed in the following equation:

$$\sigma_{IN} = \sin(90° - \theta_{NA})/\sin\theta_{NA} \quad (9)$$

In other words, the region to be assigned to the s-polarized light is defined by an intersection between a circle with a center at X=0 and a radius of the maximum effective light source $\sigma_{MAX}$ and a circle with a center at X=±($\sigma_{IN}$+1) and a radius of 1, although FIG. 7 shows only one circle with a center at X=−($\theta_{IN}$+1) and a radius of 1.

While Equation (8) defines an on-axis angular range only along the X-axis or the Y-axis, there are illumination beams those are not on the axis but are obliquely incident to the projection optical system. Since the oblique light has an angular range of $\alpha \leq \theta \leq \theta_{NA}$, a minimum value α becomes a function of Y.

A coordinate that provides a minimum angular value α is located on a circle with a center at X=$X_1$ or X=$X_2$, Y=0. From $X_1$=+($\sigma_{IN}$+1) and $X_2$=−($\sigma_{IN}$+1), a circle with a center at X=$X_1$ meets $(X-X_1)^2+Y^2=1$ and X=$X_1 \pm \sqrt{(1-Y^2)}$. For X≤1, X=$X_1 - \sqrt{(1-Y^2)}$. From α=$\tan^{-1}(Y/X)$ (0≤α≤45°), α=$\tan^{-1}(Y/X)$=$\tan^{-1}(Y/(X_1 - \sqrt{(1-Y^2)}))$. Thus, the XZ plane parallel to the X-axis but not along the X-axis has the following angular range: α≤θ≤$\theta_{NA}$ (0 ≤α≤45°), where α=$\tan^{-1}(Y/X)$=$\tan^{-1}(Y/(X_1 - \sqrt{(1-Y^2)}))$, $X_1$=+($\sigma_{IN}$+1) where $\sigma_{IN}$ is calculated from Equation (9).

The range of σ from $\sigma_{IN}$=$\sin(90° - \theta_{NA})/\sin\theta_{NA}$ to $\sigma_{MAX}$ should be assigned to be only the s-polarized light in the Y direction on the X axis.

On the other hand, illumination light that has a small incident angle $\theta_1$ in the immersion medium, which meets $\sin\theta_1 \leq \sin(90° - \theta_{NA})$ does not contribute to the imaging of fine patterns, but contributes to the imaging rough patterns with small diffracted angles. In this case, the polarization is less influential and polarization control does not need to be considered. Either the non-polarized light or polarized light can be assigned to this area, and shows little difference.

The present embodiment is thus characterized in that polarization is considered only for the light that is incident upon the hatching region in the effective light source. As shown in FIG. 4A, these hatching regions are symmetrical with respect to the Y-axis, and have a polarization direction in the Y direction for the s-polarized light or a tangential direction in a circle that defines a pupil 142 of the projection optical system 140.

The mask pattern shown in FIG. 2B that is parallel to the X direction matches, as shown in FIG. 4B, a shape shown in FIG. 4A that is rotated by 90°, and the hatching regions are symmetrical with respect to the X-axis, and have a polarization direction in the X direction as the s-polarized light. A boundary on the Y-axis is given by Equation (8). The boundary condition is the same that was calculated with respect to the X-axis.

Figure 5A:
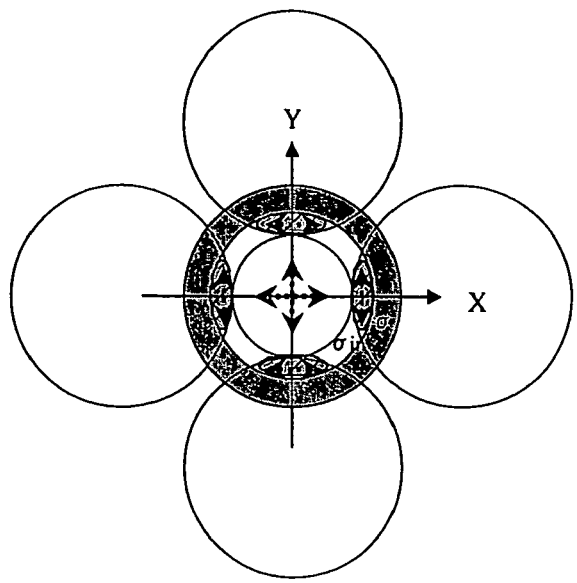
FIG. 5 is an effective light source distribution that defines polarization to expose a mask pattern shown in FIG. 2C.
Figure 5B:
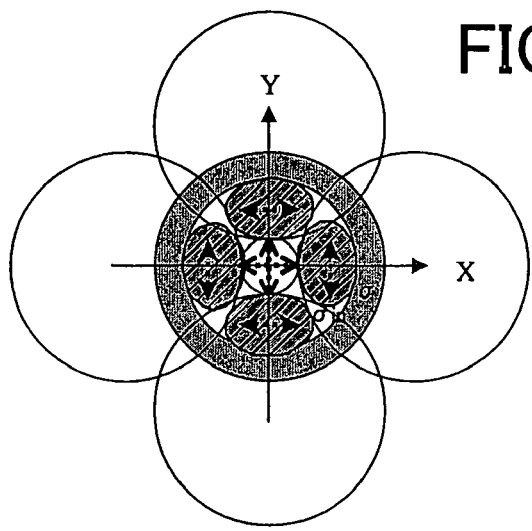
Figure 5C:
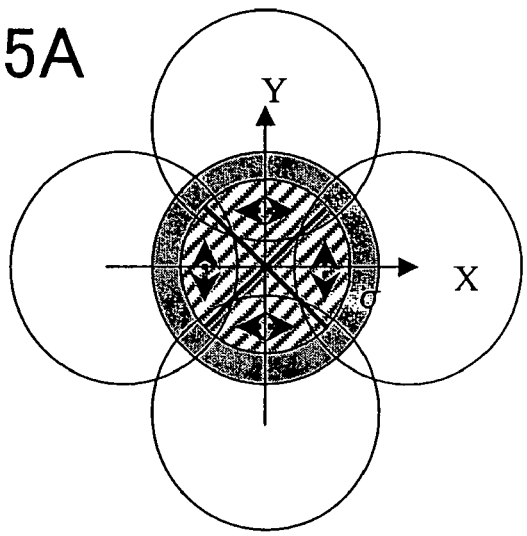
Figure 5D:
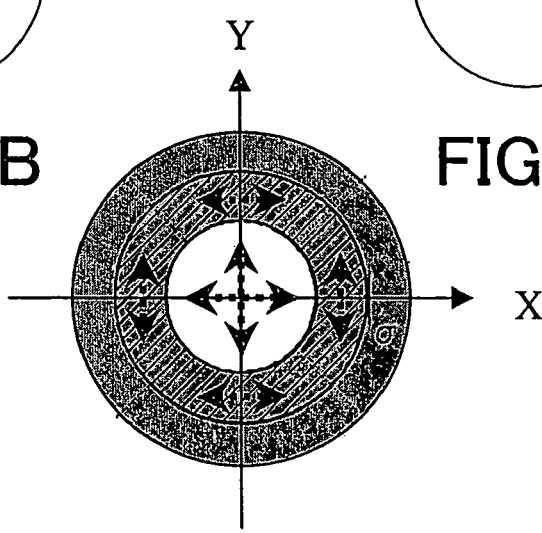

A mixture of similarly fine mask patterns shown in FIG. 2C parallel to the X-axis and the Y-axis may utilize, as shown in FIG. 5A, the hatching regions symmetrical to the X-axis and Y-axis, and have a polarization direction for s-polarized light in the X and Y directions as tangential directions. Boundary points on the X-axis and Y-axis meet Equation (8). As $\theta_{NA}$ increases, an overlap between the s-polarized region in the X direction and the s-polarized region in the Y direction occurs. Such overlapping region can be set to a non-polarized area, as shown in FIG. 5B, or have zero light intensity. As shown in FIG. 5C, the polarization may be divided with respect to the lines crossing the center as boundaries. A similar effect is available when the effective light source has a polarization-direction distribution, as shown in FIG. 5D.

Figure 8A:
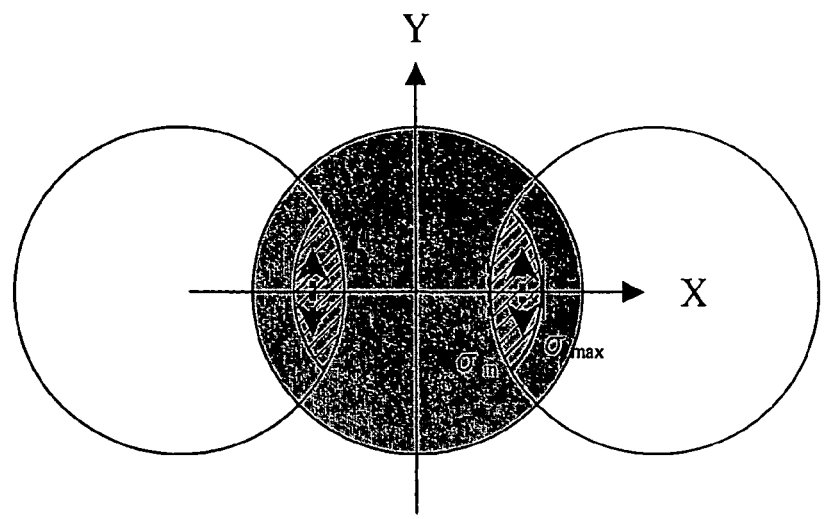
FIG. 8 is a typical view showing one example of an effective light source shape suitable for use with the mask pattern shown in FIG. 2A when the mask includes only fine patterns.
Figures 8B, 8C:
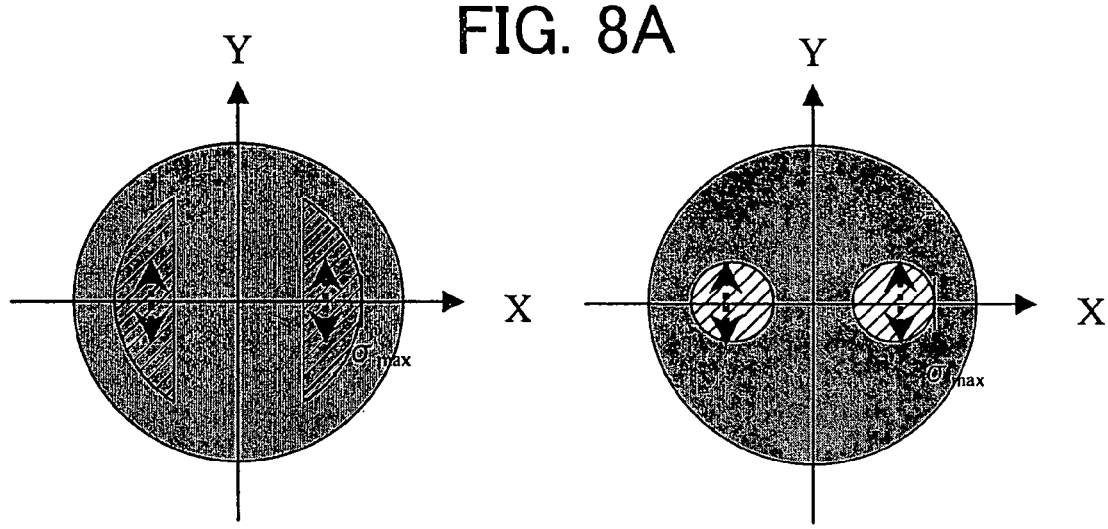
Figure 8D:
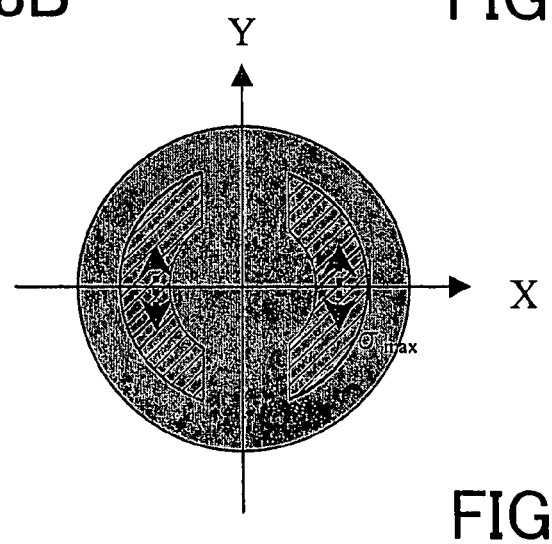

Dipole illumination shown in FIG. 8A is suitable for the mask pattern shown in FIG. 2A. The pattern is limited in the fine dimension and extends in one direction. The effective light source shown in FIG. 8A meets Equation (8) on the X-axis. When 0th order light enters the hatching region, one of ±1st order light passes the pupil. The dipole illumination is efficient for the pattern such as FIG. 2A. Only if the dipole illumination meets Equation (8) on the X-axis, various shapes are applicable, such as a shape shown in FIG. 8B that cuts a circle by a line, a shape shown in FIG. 8D that partially cuts an annulus with line, and a circle shown in FIG. 8C. In FIG. 8, the hatching part is a light transmitting part whose polarization is controlled, and a gray part is a light shielding part.

Figure 9A:
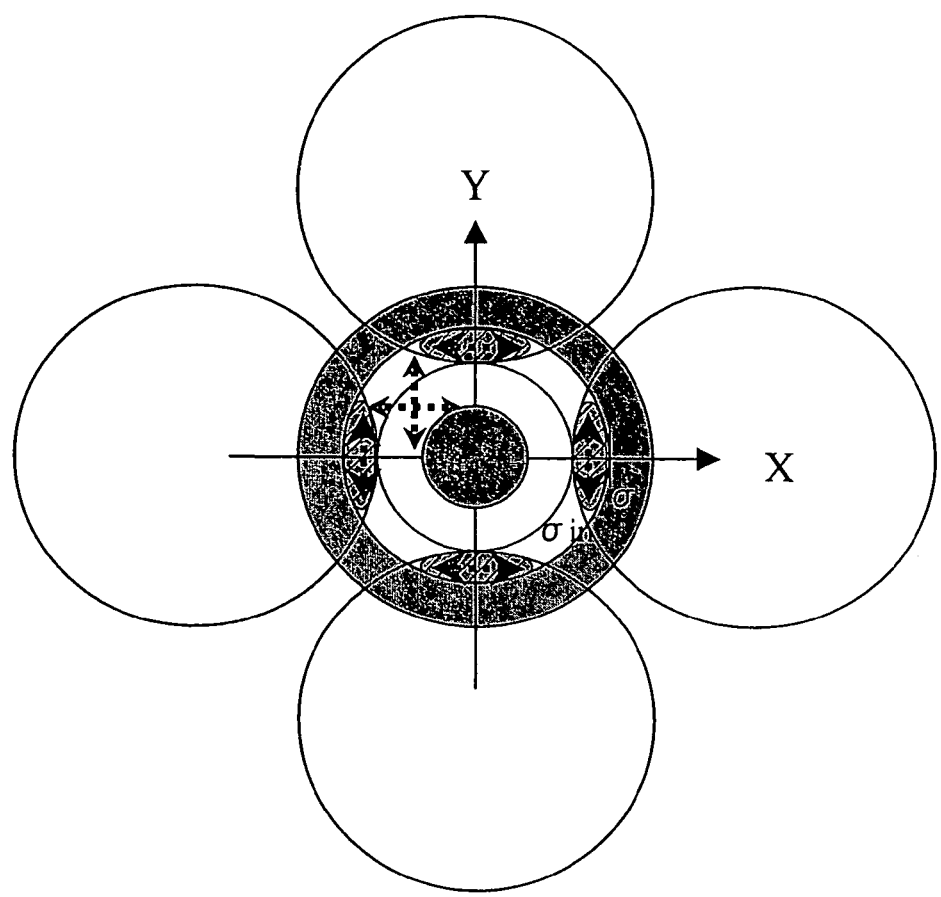
FIG. 9 is a typical view showing one example of an effective light source shape for use with the mask pattern shown in FIG. 2C when the mask includes only fine patterns.
Figure 9B:
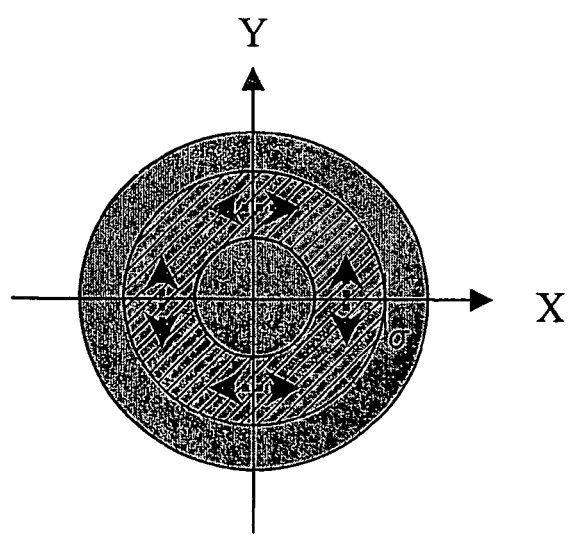

While FIG. 5 shows an exemplary effective light source suitable for the mask pattern shown in FIG. 2C that has fine patterns extending in plural directions, annular illumination shown in FIG. 9 is also applicable. In FIGS. 9A and 9B, polarizations of the hatching regions are controlled, and gray parts are light shielding parts. A white part in FIG. 9A is a light transmitting part. Outer and inner diameters in the annular illumination area set within a range that meets Equation (8) on the X-axis and Y-axis, and polarization direction is set to the illustrated tangential direction. Boundaries of polarization located at portions of ±45° may be non-polarized. Alternatively, polarization directions in the X and Y directions may be replaced with each other here.

Figure 10:
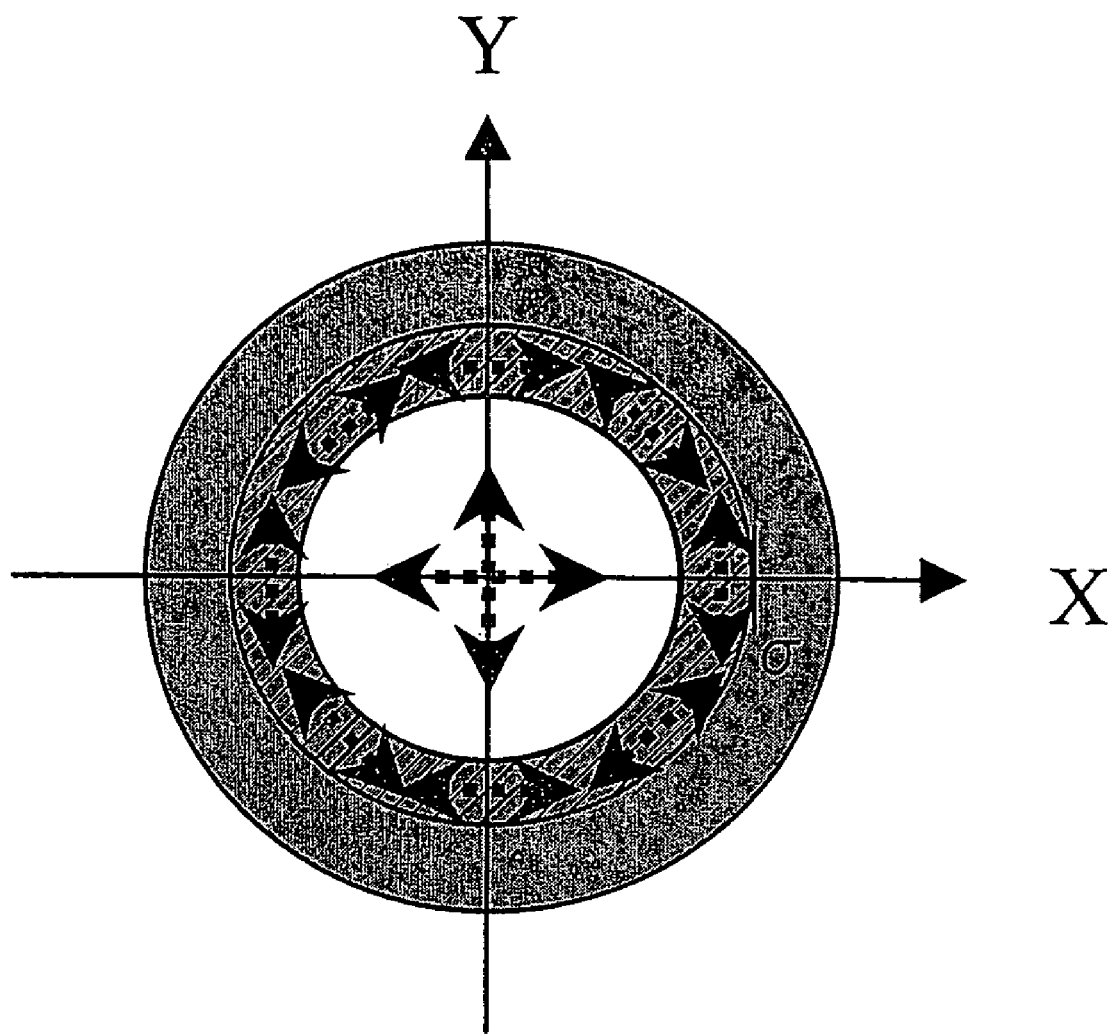
FIG. 10 is a typical view showing one example of an effective light source shape for use with mask patterns that extend in various directions.

A pattern that mixes 45° directions oblique to the X-axis and Y-axis can assign the s-polarized light to an area that meets Equation (8) according to pattern directions as shown in FIG. 10. In this case, σ range in the 45° directions is the same as Equation (8) according to the rotational symmetry.

It is difficult in an actual optical system to insert a polarization element into the projection optical system 140 due to problems of heat aberration, etc. Accordingly, the present embodiment controls polarization of a predetermined area of the effective light source prior to the reticle 130. For example, polarization control part 117 provided prior to the optical integrator 118 is used to control polarization. The optical integrator 118 includes a portion conjugate to the pupil 142 of the projection optical system 140. To control the polarization state at the optical integrator 118 is preferable in order to simplify the optical system. The aperture stop 120 adjusts the shape of the effective light source. The aperture stop 120 can control polarization.

The projection optical system 140, except for a special configuration, usually does not have directional property of. Therefore, the conventional non-immersion system has treated the illumination light in a non-polarized state. That the illumination light does not have a special state of p-polarized light and s-polarized light in the radius $\sigma(\sigma \leq 1)$ or smaller on the effective light source. In case of immersion, however, it is understood, when the frequency components of imaging light are considered, that the polarization condition suitable for imaging patterns in the X or Y direction exists. This condition corresponds to the polarization property in the aforementioned tangential direction or s-polarization characteristic. The polarization effect provides a different degree of deterioration to low and high frequency patterns by the contribution from the p-polarized light. High frequency patterns use the peripheral regions of the pupil only, and very sensitive to the polarization effect. On the other hand, the low frequency patterns use all the area and are not be influence by the polarization much.

It is thus unnecessary to consider the influence of polarized light because of the small contrast reduction in low frequency components inside the pupil 142 of the projection optical system 140. An optical system for imaging rough patterns can be designed without considering polarization effects, since the polarization state is less influential on the resolution performance.

Therefore, the effective light source shapes shown in FIGS. 4, 5 and 8–10 proposed by the present embodiment may assign any polarized light to its area on the effective light source outside the hatching region. The hatching region must have tangential polarization. The number of pattern directions determines the way of defining the area to be assigned to the s-polarized light, and Equation (8) determines the region on the axis which has the direction orthogonal to the pattern line direction. The selected regions must be symmetrical. In other words, when a pattern has one direction, two regions should be assigned to the s-polarized light as shown in FIG. 4; when a pattern has two directions, four regions should be assigned to the s-polarized light as shown in FIG. 5; when a pattern has three or four directions, a region should be assigned to the s-polarized light has approximately an annular shape as shown in FIG. 10. The effective light source shapes shown in FIGS. 8 and 9 are suitable in order to improve fine resolving power for a pattern that does not includes a large pattern but includes only fine patterns. The way of selecting a region to be assigned to the s-polarized light is the same as FIGS. 4 and 5, but different from FIGS. 4 and 5 in that the center part is light-shielded.

The present embodiment realizes the effective light source shapes shown in FIGS. 4, 5 and 8–10 by an aperture shape of the aperture stop 120. These effective light source shapes are embodied as shapes of light transmitting and shielding parts of the aperture stop 120. The present embodiment arranges plural types of aperture stops having these plural effective light source shapes on a turret, so that the actuator 121 may switch them. Similarly, plural types of polarization elements corresponding to aperture shapes of the aperture stops are arranged on a turret so that an actuator (not shown) can switch them. One aspect of the present invention also involves an illumination optical system and exposure apparatus, which have the aperture stop 120 and polarization control element. The exposure apparatus has various exposure modes which control both the shape and polarization of the effective source.

In the exposure operation, beams emitted from the laser 112 are reshaped into a desired beam shape by the beam shaping system 114, and then enter the illumination optical system. The condensing optical system 116 guides the beams to the optical integrator 118 efficiently. At that time, the exposure-amount regulator adjusts the exposure dose of the illumination light.

The main control unit 150 recognizes mask pattern information in response to an input by a user through the input device in the monitor and input device 152, or by reading, for example, a barcode formed on the mask, and selects the aperture shape and the polarization state as the illumination conditions suitable for the mask patterning by driving the actuator for the aperture stop 120 and the actuator (not shown) for the polarization control part 117. For example, the main control unit 150 sets the polarization state as shown in FIG. 4A for the mask pattern shown in FIG. 2A.

The optical integrator 118 makes the illumination light uniform, and the aperture stop 120 sets a desired effective light source shape. Such illumination light illuminates the mask 130 under optimal conditions through the deflecting mirror 124, the masking blade 126 and imaging lens 128.

Beams that have passed the mask 130 are projected under a specific magnification onto the plate 400 by the projection optical system 140. The exposure apparatus of a step-and-scan type would fix the light source 112 and the projection optical system 140, and synchronously scan the mask 130 and wafer 170, then exposing the entire shot. The wafer stage 176 is stepped to the next shot and the new scan operation is done. By repeating this exposure scanning and stepping, many shots are exposed to the wafer 170. The exposure apparatus of a step-and-repeat type, the exposure operation is done while the mask 130 and the wafer 170 in a stationary state, and the stepping operation follows.

Since the bottom surface of the projection optical system 140 closest to the wafer 170 is immersed in the liquid 180 that has a higher refractive index than that of the air, the projection optical system 150 has a higher NA, and finer resolution is achieved. In addition, the polarization control forms an image with higher contrast on the resist 172. As a result, the exposure apparatus 100 can perform a precise pattern transfer onto the resist, can provide high-quality devices (such as semiconductor devices, LCD devices, photographing devices (such as CCDs, etc.), thin film magnetic heads, and the like).

EXAMPLE 1

A description will be given of an example 1 according to the present invention utilizing the immersion type exposure apparatus 100. The exposure apparatus 100 uses ArF excimer laser (with a wavelength of 193 nm) as the light source 112, and projection optical system 140 having a numerical aperture of 1.32, wherein the largest angle $\theta_{NA}$ in the liquid 180 meets sin $\theta_{NA}$=0.9, the liquid 180 has a refractive index of 1.47, and the illumination system meets $\sigma_{MAX}$=0.9. The projection exposure apparatus is a reduction projection exposure. While a target pattern size and a mask pattern size are different according to the reduction ratio of the exposure apparatus. The following description converts a pattern size on the mask 130 into a size on the wafer 170.

Figure 11A:
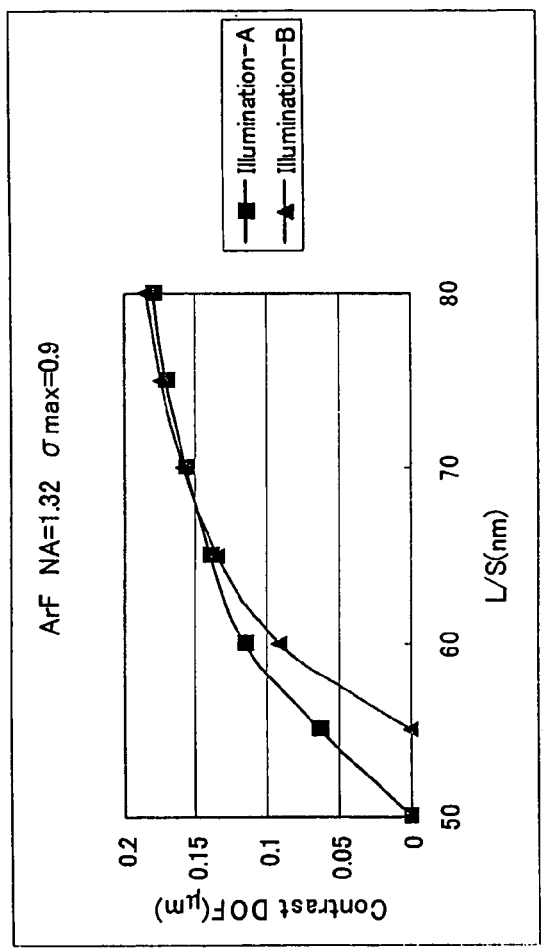
FIG. 11 is a graph showing a relationship between a pitch and contrast depth in the mask pattern shown in FIG. 2C.
Figure 11A:
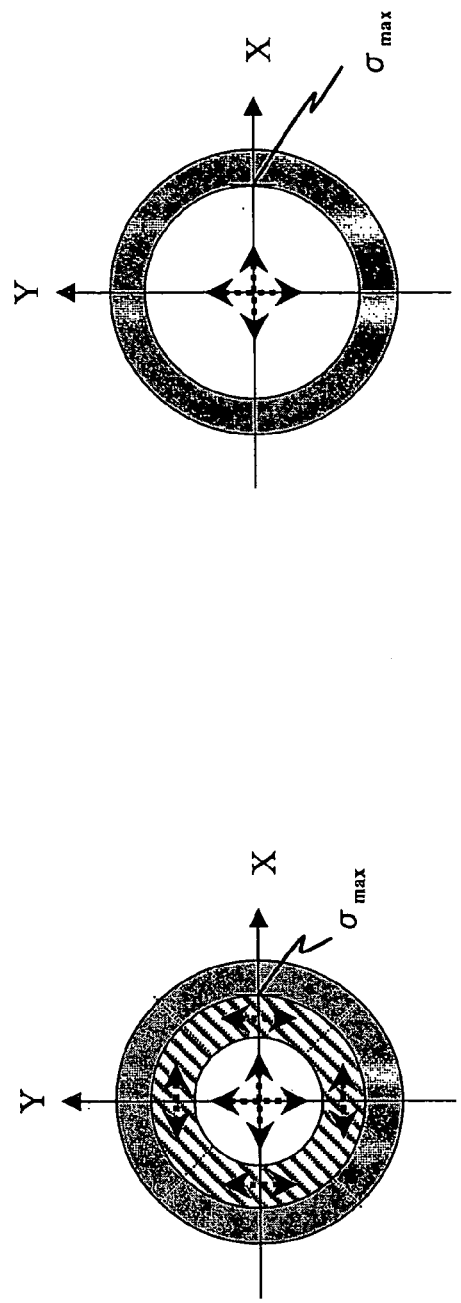
Figure 11B:
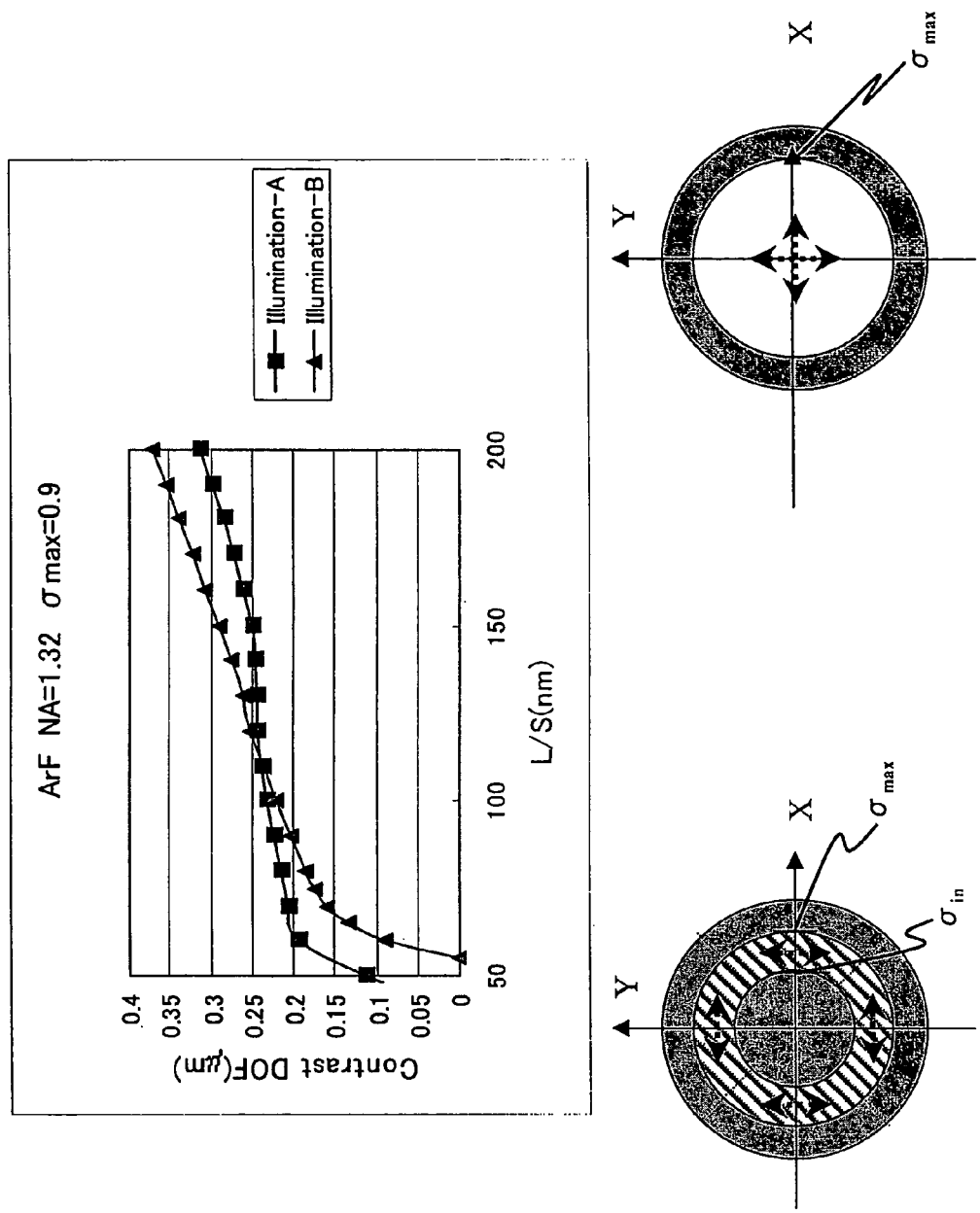

FIGS. 11A and 11B show contrast depths ($\mu$m) while varying critical dimensions and intervals, or pitches, in the mask pattern shown in FIG. 2C which mixes line- and-space ("L/S") patterns that have an equal critical dimension and interval, and extend in the X and Y directions.

When sin $\theta_{NA}$=0.9, $\theta_{NA}$ was 64°. Sin(90−$\theta_{NA}$)/sin $\theta_{NA}$=0.44/0.9=0.49. Since a value of $\sigma$ corresponding to a region upon which only the s-polarized light is incident along an axis parallel to the pattern direction should meet 0.44/0.9≦$\sigma$≦$\sigma_{MAX}$, the illumination system should be designed so that the s-polarized light region is assigned to an area that meets about 0.5≦$\sigma$≦0.9.

FIG. 11A also shows contrast depths of focus($\mu$m) for the illumination condition illustrated in FIG. 5D, in which a non-polarized circular effective light source with $\sigma$ of 0.5, and the tangentially polarized region between 0.5≦$\sigma$≦0.9 are realized and corresponds to the illumination "A" in FIG. 11A. It is compared with a non-polarized circular effective light source that meets $\sigma_{MAX}$=0.9 shown in FIG. 6 and corresponds to the illumination "B" in FIG. 11A. The polarization control increases the depth of focus for fine critical dimensions, extending resolution limits, while that in large dimension does not change greatly. It is thus confirmed that the depths of focus can be improved for fine critical dimensions. The reduced contrast in non-polarization is a major problem in resolving fine patterns, but it is found that fine patterns can be resolved by using an effective light source that controls polarization.

FIG. 11B also shows contrast depths of focus($\mu$m) for annular illumination that shields inside $\sigma$0.5 and has polarization in a tangential direction shown in FIG. 9B that meets 0.5≦$\sigma$≦0.9 and corresponds to the illumination "A" in FIG. 11B, which is to be compared with a non-polarized circular effective light source that meets $\sigma_{MAX}$=0.9 shown in FIG. 6 and corresponds to the illumination "B" in FIG. 11B. Light shielding in a range of $\sigma$≦0.5 cuts low frequency components inside the pupil in the optical system, and increases a depth for fine critical dimensions without reducing depths for large dimensions, greatly extending resolution, limits. For patterning the fine patterns, the effect of s-polarized light is apparent.

EXAMPLE 2

A description will be given of an example 2 according to the present invention utilizing the immersion type exposure apparatus. Similar to the example 1, this exposure apparatus uses ArF excimer laser (with a wavelength of 193 nm) as the light source 112, and projection optical system 140 having a numerical aperture of 1.32, wherein the largest angle $\theta_{NA}$ in the liquid 180 meets sin $\theta_{NA}$=0.9, the liquid 180 has a refractive index of 1.47, and the illumination system has $\sigma_{MAX}$=0.9.

Figure 12A:
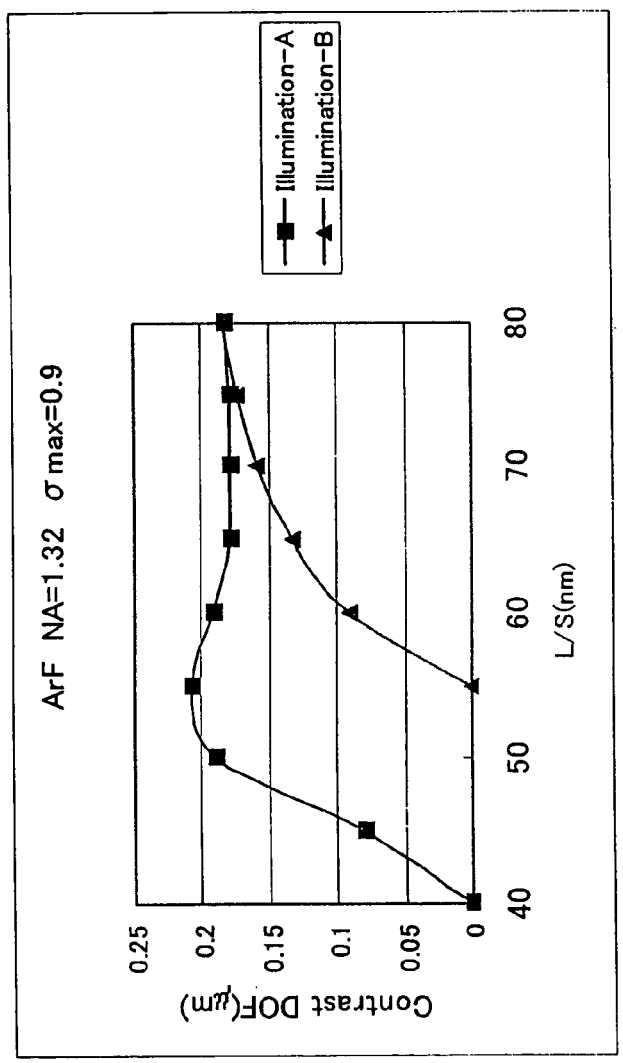
FIG. 12 is a graph showing a relationship between a pitch and contrast depth in the mask pattern shown in FIG. 2A.
Figure 12A:
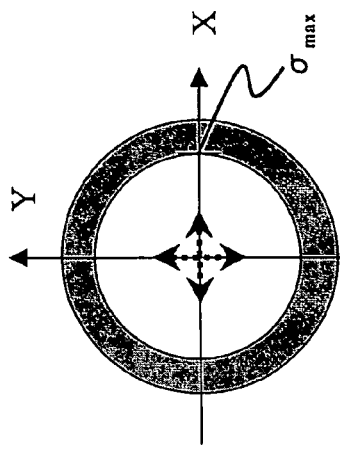
Figure 12A:
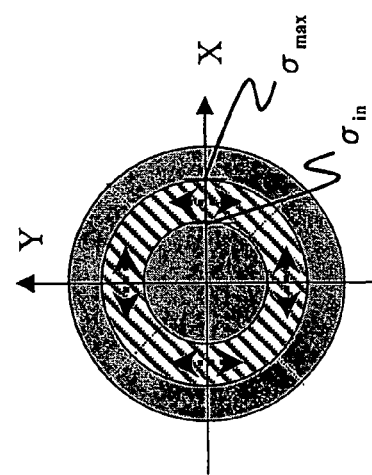
Figure 12B:
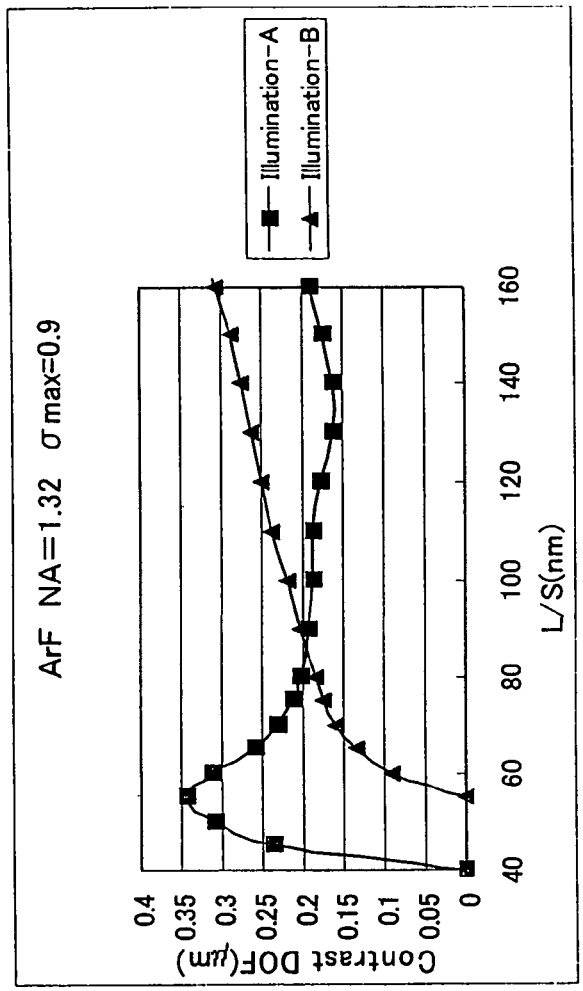
Figure 12B:
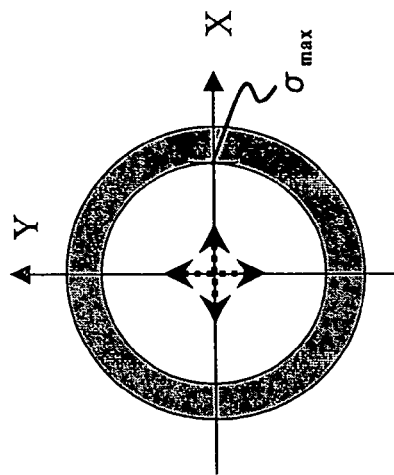
Figure 12B:
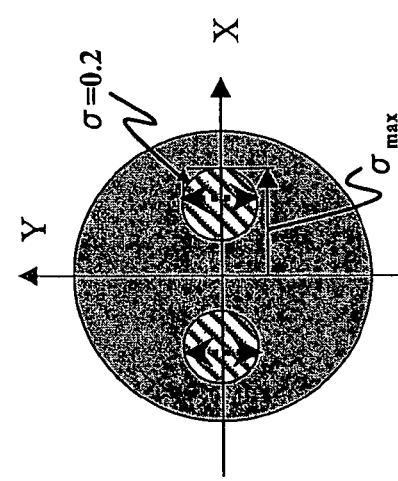

FIGS. 12A and 12B show contrast depths of focus($\mu$m) while varying critical dimensions and intervals, or pitches, in the unidirectional mask pattern shown in FIG. 2A which includes L/S patterns that have an equal critical dimension and interval, and extend parallel to the Y directions.

When sin $\theta_{NA}$=0.9, $\theta_{NA}$ was 64°. sin (90−$\theta_{NA}$)/sin $\theta_{NA}$=0.44/0.9=0.49. Since a value of $\sigma$ corresponding to a region upon which only the s-polarized light is incident along the axis parallel to the pattern direction should meet 0.44/0.9≦$\sigma$≦$\sigma_{MAX}$, the illumination system should be designed so that the s-polarized light region is assigned to an area that meets about 0.5≦$\sigma$≦0.9.

FIG. 12A also shows contrast depths of focus($\mu$m) for polarization in a tangential direction shown in FIG. 5D that meets 0.68≦$\sigma$≦0.9 and corresponds to the illumination "A" in FIG. 12A, which is to be compared with a non-polarized circular effective light source that meets $\sigma_{MAX}$=0.9 shown in FIG. 6 and corresponds to the illumination "B" in FIG. 12A. Control over the polarization increases a depth for fine critical dimensions, extending resolution limits, without reducing depths for large critical dimensions, greatly extending resolution limits. A significant effect is available in case of such a unidirectional pattern. It is thus confirmed that the depths of focus can be improved for fine critical dimensions. The reduced contrast in non-polarization is a major problem in resolving fine patterns, but it is clear that fine patterns can be resolved by using an effective light source that controls polarization.

The illumination "A" that includes polarized light in a tangential direction within a range of 0.68≦$\sigma$≦0.9 satisfies only part of predefined condition for the s-polarized light area, which requires polarized light in a tangential direction within a range of 0.5≦$\sigma$≦0.9. Instead, it can be said that no polarized light is used which is orthogonal to the tangential direction within a range of 0.5≦$\sigma$≦0.9. In other words, the condition that requires polarized light in a tangential direction within a range of 0.5≦$\sigma$≦0.9 is replaced with the condition that eliminates polarized light orthogonal to the tangential direction within a range of $0.5 \leq \sigma \leq 0.9$.

FIG. 12B also shows contrast depths (μm) for illumination shown in FIG. 8C with $0.5 \leq \sigma \leq 0.9$, and a tangential center point at X=0.7 and a radius of 0.2 on a pupil coordinate system (corresponding to the illumination "A" in FIG. 12B), which is to be compared with a non-polarized circular effective light source that meets $\sigma_{MAX}=0.9$ shown in FIG. 7 and corresponds to the illumination "B" in FIG. 12B. Light shielding in a range of $\sigma \leq 0.5$ cuts low frequency components inside the pupil in the optical system, and increases a depth for fine critical dimensions without reducing depths for large critical dimensions, greatly extending resolution limits. When only the fine patterns exist, light except the s-polarized light can be shielded without problem. Almost the same effect is available even when the dipole illumination has a shape shown in FIG. 8A, 8B or 8d, and a result thereof will be omitted. The reduced contrast in non-polarization is a major problem in resolving fine patterns, but it is clear that fine patterns can be resolved by using an effective light source that controls polarization.

While the present example discusses with NA=1.32, an effect of this exposure method remarkably appears as NA is higher and as patterns become finer. The immersion optical system has a point where the imaging contrast for p-polarized light becomes 0. This phenomenon significantly reduces the depth of focus of the conventional exposure system.

Figure 13:
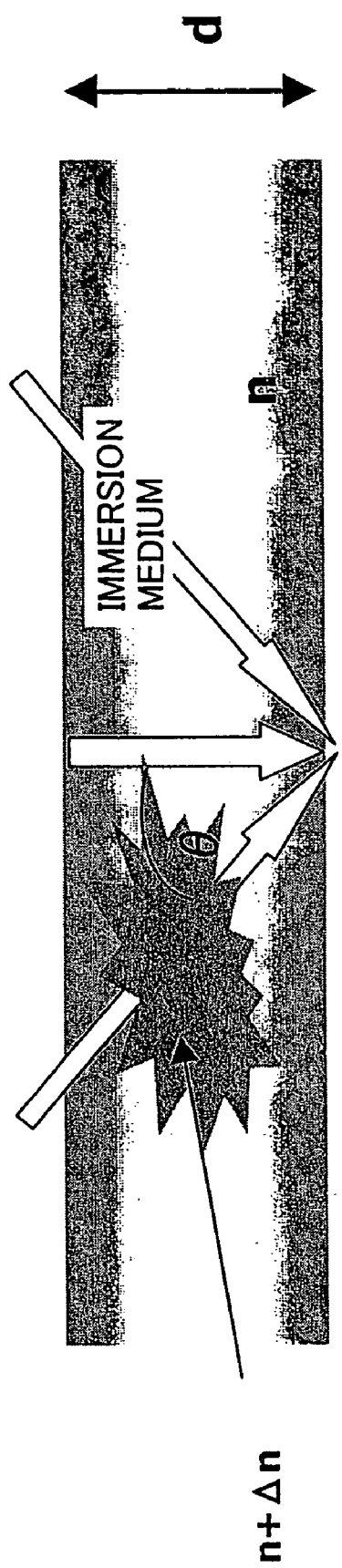
FIG. 13 is a schematic view for explaining fluctuations of a medium (liquid) shown in FIG. 1.

While the present embodiment discusses polarization peculiar to the immersion type projection optical system, the immersion has another big problem of fluctuations of the liquid 180 itself. While it is assumed that the liquid 180 has a refractive index of $n_o$, a lump may have a refractive index of $n_o+\Delta n$ due to the fluctuations of temperature, for example, as shown in FIG. 13. When the fluctuation occurs, the absolute value $\Delta W$ of the fluctuation of wave front aberration has the largest value expressed by the following Equation:

$$\Delta W = \Delta n \cdot d / \cos \theta_{MAX} \quad (10)$$

where d is a thickness of the immersion medium, and the following Equation (11) is led from Equation (10):

$$d \leq (30 m \lambda) \cdot \cos \theta_{MAX} / \Delta n \quad (11)$$

When a allowable amount of $\Delta W$ is 30 m λ, $\theta_{MAX}=60°$, a wavelength is 193 nm, $\Delta n=10$ ppm in Equation 11, $d \leq 3000\lambda \cos \theta_{NA}=0.29$ nm, a value of attainable value. Only when d is small, influence of any fluctuation may be reduced. Accordingly, it is important for the immersion exposure system to make d as small as possible.

Pure water is suitable for the liquid 180 for immersion exposure that utilizes ArF excimer laser. However, among the elements in the projection optical system 140, the last element, which is the closest to the wafer 170, of the projection optical system 140 contacts the liquid 180 that receives the largest optical energy. Therefore, quartz is not available due to the durability of a glass material, such as compaction, and calcium fluoride should be used. However, calcium fluoride has deliquescence and gets damaged when contacting water. A film for the ArF region has conventionally been usually manufactured with evaporation method, but an evaporated film is so porous that calcium fluoride gets damaged through holes. Accordingly, the present embodiment is characterized in using a sputtered film for a bottom surface of the projection optical system 140 which contacts the liquid 180, protecting the calcium fluoride substrate and achieving anti-reflection. Therefore, a sputtered film using, for example, $MgF_2$ is one of the suitable material for this purpose.

Figure 14:
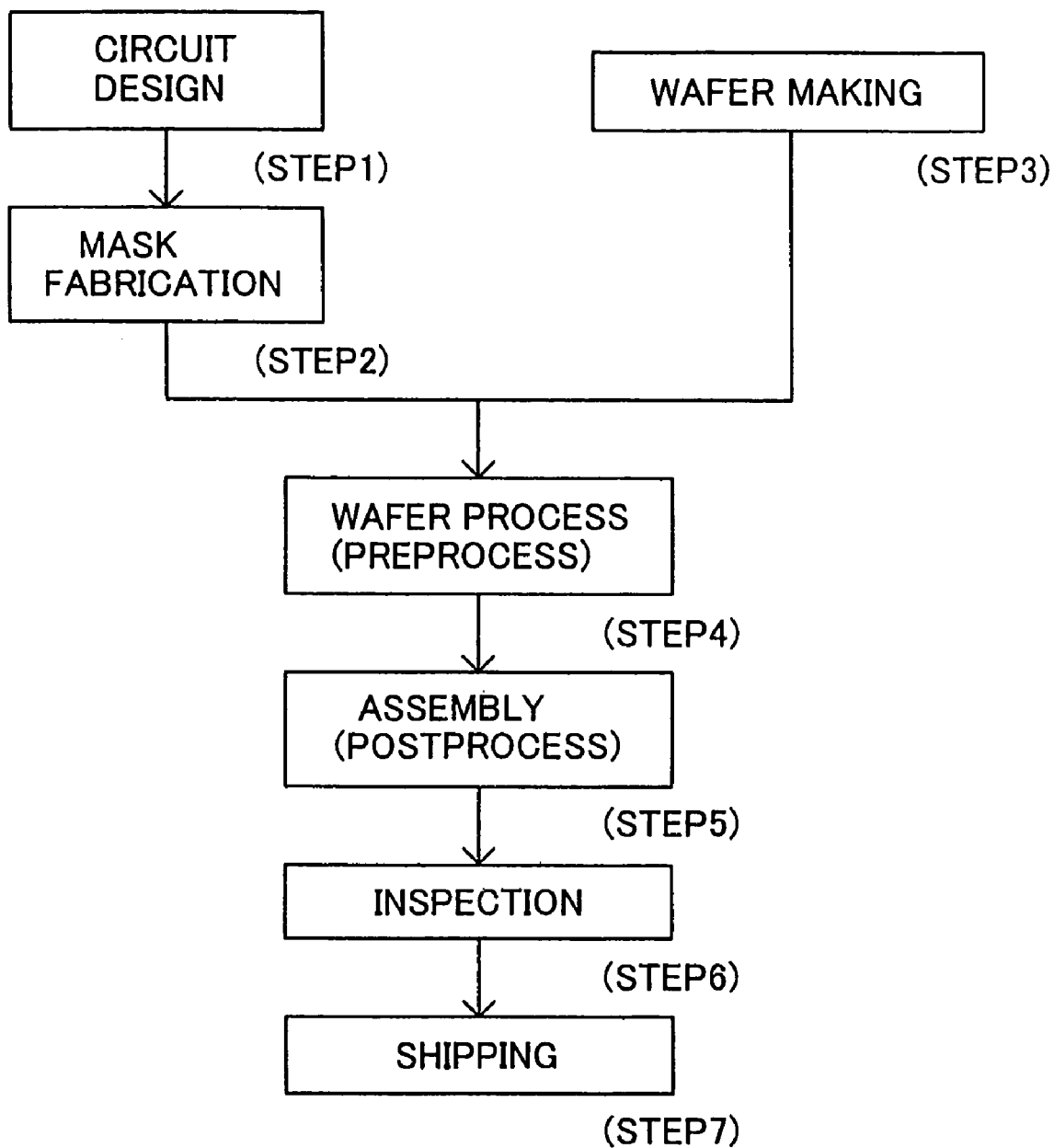
FIG. 14 is a flowchart for explaining a device manufacture method that uses the instant exposure apparatus.
Figure 15:
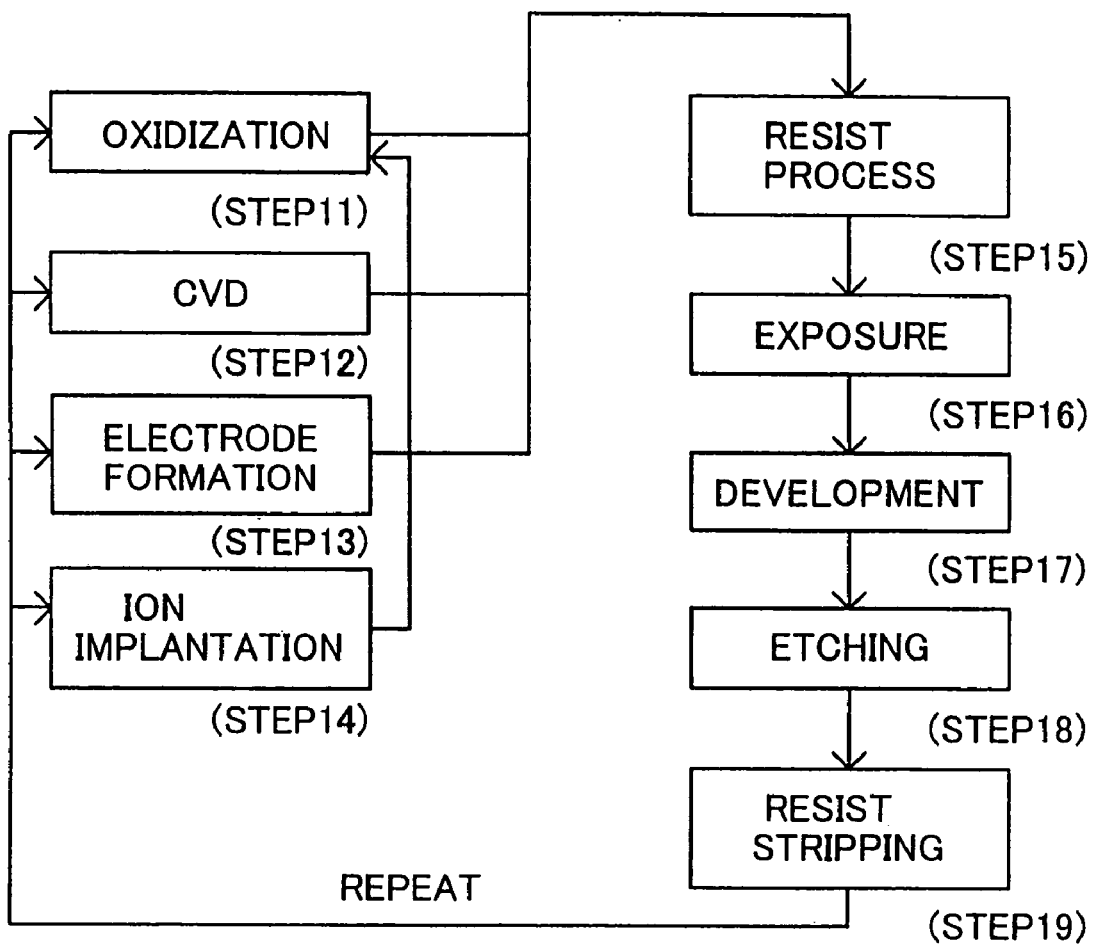
FIG. 15 is a detail flowchart of a wafer process as Step 4 shown in FIG. 13.

Referring to FIGS. 14 and 15, a description will now be given of an embodiment of a device fabricating method using the above exposure apparatus 100. FIG. 14 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 15 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacture method of the present invention may manufacture higher quality devices than the conventional one. Thus, the device manufacture method using the inventive lithography, and resultant devices themselves as intermediate and finished products also constitute one aspect of the present invention. Such devices include semiconductor chips like an LSI and VLSI, CCDs, LCDs, magnetic sensors, thin film magnetic heads, and the like.

Thus, the present invention can provide an immersion type exposure method and apparatus which prevent deteriorated imaging performance due to influence of polarization, maintain desired contrast, and form a desired pattern.

Further, the present invention is not limited to these preferred embodiments, and various modifications and changes may be made in the present invention without departing from the spirit and scope thereof.

What is claimed is:

1. An exposure method for transferring a pattern formed on a mask onto an object to be exposed, said method comprising:
   directing exposure light having a wavelength λ (nm) through a projection optical system that is at least partially immersed in liquid and has a numerical aperture of $n_o \cdot \sin \theta_{NA}$ greater than 0.9 in order to transfer a pattern formed on a mask onto an object to be exposed;
   wherein $n_o$ is a refractive index of the liquid, $\Delta n$ is a fluctuation of refractive index of the liquid, $\theta_{NA}$ is the largest angle common to the liquid and a resist material applied to the object to be exposed, and d is a thickness of the liquid in an optical-axis direction of the projection optical system which satisfies $d \leq (0.03\lambda)\cos\theta_{NA}/\Delta n$.

* * * * *

UNITED STATES PATENT AND TRADEMARK OFFICE
CERTIFICATE OF CORRECTION

| | |
|---|---|
| PATENT NO. | : 7,126,667 B2 |
| APPLICATION NO. | : 11/377184 |
| DATED | : October 24, 2006 |
| INVENTOR(S) | : Miyoko Kawashima et al. |

It is certified that error appears in the above-identified patent and that said Letters Patent is hereby corrected as shown below:

On the Title page of the printed patent, the following information should appear after the listing of the Inventors.
(73) Assignee: Canon Kabushiki Kaisha, Tokyo (JP)

Signed and Sealed this
Eleventh Day of June, 2013

Teresa Stanek Rea
*Acting Director of the United States Patent and Trademark Office*